US009196653B2

(12) United States Patent
Leatherdale et al.

(10) Patent No.: US 9,196,653 B2
(45) Date of Patent: Nov. 24, 2015

(54) PIXELATED LED

(75) Inventors: Catherine A. Leatherdale, Woodbury, MN (US); Zhaohui Zy Yang, North Oaks, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 477 days.

(21) Appl. No.: 13/384,347

(22) PCT Filed: Jul. 27, 2010

(86) PCT No.: PCT/US2010/043344
§ 371 (c)(1),
(2), (4) Date: Jan. 17, 2012

(87) PCT Pub. No.: WO2011/014490
PCT Pub. Date: Feb. 3, 2011

(65) Prior Publication Data
US 2012/0119237 A1    May 17, 2012

Related U.S. Application Data

(60) Provisional application No. 61/229,792, filed on Jul. 30, 2009.

(51) Int. Cl.
*H01L 29/18*  (2006.01)
*H01L 33/00*  (2010.01)
(Continued)

(52) U.S. Cl.
CPC .............. *H01L 27/156* (2013.01); *H01L 33/20* (2013.01); *H01L 33/44* (2013.01); *H01L 33/50* (2013.01)

(58) Field of Classification Search
USPC .......................................................... 257/88
See application file for complete search history.

(56) References Cited

U.S. PATENT DOCUMENTS 5,087,949 A    2/1992   Haitz
5,485,015 A *  1/1996   Choi ............................. 257/21
(Continued)

FOREIGN PATENT DOCUMENTS

JP    2009-076647    4/2009
KR    2006-0125079   12/2006
(Continued)

OTHER PUBLICATIONS

Bove, "Personal Projection, or How to Put a Large Screen in a Small Device", Massachusetts Institute of Technology Media Laboratory, 2003, 4 pages, May 2003.
(Continued)

*Primary Examiner* — Matthew Landau
*Assistant Examiner* — Igwe U Anya
(74) *Attorney, Agent, or Firm* — Gregg H. Rosenblatt

(57) ABSTRACT

A pixelated light emitting diode (LED) and a method for pixelating an LED are described. The pixelated LED includes two or more monolithically integrated electroluminescent elements disposed adjacent each other on a substrate, wherein at least a portion of each electroluminescent element immediately adjacent the substrate includes an inverted truncated pyramidal shape. The method for pixelating an LED includes selectively removing material from the major surface of an LED to a depth below the emissive region, thereby forming an array of inverted truncated pyramid shapes. The efficiency of the pixelated LEDs can be improved by incorporating the truncated pyramidal shape. Additionally, the crosstalk between adjacent LED pixels can be reduced by incorporating the truncated pyramidal shape.

13 Claims, 21 Drawing Sheets

(51) Int. Cl.
*H01L 27/15* (2006.01)
*H01L 33/20* (2010.01)
*H01L 33/44* (2010.01)
*H01L 33/50* (2010.01)

(56) References Cited

U.S. PATENT DOCUMENTS

| | | | |
|---|---|---|---|
| 5,915,193 | A | 6/1999 | Tong |
| 6,563,133 | B1 | 5/2003 | Tong |
| 6,987,288 | B2 | 1/2006 | Rattier |
| 6,995,030 | B2* | 2/2006 | Illek et al. ............... 438/29 |
| 7,161,188 | B2 | 1/2007 | Orita |
| 7,423,297 | B2 | 9/2008 | Leatherdale |
| 8,141,384 | B2 | 3/2012 | Barnes |
| 2001/0000209 | A1 | 4/2001 | Krames |
| 2001/0000410 | A1 | 4/2001 | Krames |
| 2001/0038101 | A1 | 11/2001 | Nemoto |
| 2002/0017652 | A1 | 2/2002 | Illek |
| 2003/0141496 | A1 | 7/2003 | Illek |
| 2006/0011935 | A1* | 1/2006 | Krames et al. ............ 257/99 |
| 2006/0094322 | A1 | 5/2006 | Ouderkirk |
| 2006/0094340 | A1 | 5/2006 | Ouderkirk |
| 2006/0124917 | A1 | 6/2006 | Miller |
| 2007/0116423 | A1 | 5/2007 | Leatherdale |
| 2007/0284565 | A1 | 12/2007 | Leatherdale |
| 2007/0284603 | A1 | 12/2007 | Haase |
| 2007/0290190 | A1 | 12/2007 | Haase |
| 2008/0237629 | A1 | 10/2008 | Ando |
| 2009/0166654 | A1* | 7/2009 | Gan et al. ................ 257/98 |
| 2009/0256494 | A1* | 10/2009 | Nishinaka et al. ........ 315/291 |

FOREIGN PATENT DOCUMENTS

| | | |
|---|---|---|
| WO | WO 2008-064068 | 5/2008 |
| WO | WO 2008-109296 | 9/2008 |

OTHER PUBLICATIONS

Graham-Rowe, "Projectors get personal", Nature Photonics 1, 2007, pp. 677-679, Dec. 2007.

Guilhabert,"Patterning and integration of polyfluorene polymers on micro-pixellated UV AlInGaN light-emitting diodes," J. Phys. D: Appl. Phys, 2008, vol. 41, No. 094008, 4 pages, Apr. 2008.

Hern'Andez, "Micro Laser Personal Projector," Massachusetts Institute of Technology, May 2003, 81 pages.

Lin, "InGaN-Based Light-Emitting Diodes with a Cone-Shaped Sidewall Structure Fabricated Through a Crystallographic Wet Etching Process", Electrochemical and Solid State Letters, 12 (7), 2009, pp. H233-H237, Apr. 2009.

Tong, "Semiconductor Wafer Bonding", John Wiley & Sons, New York, Chapters 4 and 10, 1999, 39 pages, Dec. 1998.

* cited by examiner

PIXELATED LED

CROSS REFERENCE TO RELATED APPLICATIONS

This application is a national stage filing under 35 U.S.C. 371 of PCT/US2010/043344, filed Jul. 27, 2010, which claims priority to U.S. Application No. 61/229,792, filed Jul. 30, 2009, the disclosure of which is incorporated by reference in their entirety herein.

BACKGROUND

Illumination systems are used in many different applications, including projection display systems, backlights for liquid crystal displays and the like. Projection systems typically use one or more white light sources, such as high pressure mercury lamps. The white light beam is usually split into three primary colors, red, green and blue, and is directed to respective image forming spatial light modulators to produce an image for each primary color. The resulting primary-color image beams are combined and projected onto a projection screen for viewing.

More recently, light emitting diodes (LEDs) have been considered as an alternative to white light sources. LEDs have the potential to provide the brightness and operational lifetime that would compete with conventional light sources. Current LEDs, however, especially green emitting LEDs, are relatively inefficient.

Conventional light sources are generally bulky, inefficient in emitting one or primary colors, difficult to integrate, and tend to result in increased size and power consumption in optical systems that employ them.

SUMMARY

In one aspect, the present disclosure provides a pixelated light emitting diode (LED), that includes two or more monolithically integrated electroluminescent elements disposed adjacent each other on a substrate, wherein at least a portion of each electroluminescent element immediately adjacent the substrate includes an inverted truncated pyramidal shape. Further, each of the electroluminescent elements include a p-doped semiconductor disposed adjacent the substrate, an n-doped semiconductor disposed adjacent the p-doped semiconductor and opposite the substrate, and an emissive region between the n-doped semiconductor and the p-doped semiconductor.

In another aspect, the present disclosure provides a pixelated LED that includes two or more monolithically integrated electroluminescent elements disposed adjacent each other on a substrate, each electroluminescent element including a p-n junction having a first major light emitting surface and a smaller opposing second major surface adjacent the substrate.

In another aspect, the present disclosure provides a pixelated LED that includes two or more monolithically integrated electroluminescent elements disposed adjacent each other on a substrate, each electroluminescent element including a p-n junction having a first major light emitting surface and an opposite second major surface adjacent the substrate, wherein the substrate between immediately adjacent second major surfaces includes a surface that absorbs visible light.

In another aspect, the present disclosure provides a method for pixelating an LED that includes providing a slab p-n junction on a first substrate, the slab p-n junction including a major surface opposite the first substrate, and an emissive region parallel to the major surface. The method further includes selectively removing material from the major surface to a depth below the emissive region, such that a plurality of base portions remain at the major surface, thereby forming an array of inverted truncated pyramid shapes. The method further includes depositing a first electrode on each of the base portions; bonding each of the first electrodes to a second substrate; removing the first substrate, thereby exposing a light emitting surface of the slab p-n junction; and depositing a second electrode on the light emitting surface.

In another aspect, the present disclosure provides a method for pixelating an LED that includes providing a slab p-n junction on a first substrate, the slab p-n junction including a major surface opposite the first substrate, and an emissive region parallel to the major surface. The method further includes selectively depositing a plurality of first electrodes on the major surface; bonding each of the first electrodes to a second substrate; and removing the first substrate, thereby exposing a light emitting surface of the slab p-n junction. The method further includes selectively removing material from the light emitting surface to a depth of the major surface, such that a plurality of pixels remain at the light emitting surface, thereby forming an array of inverted truncated pyramid shapes; and depositing a second electrode on the light emitting surface.

The above summary is not intended to describe each disclosed embodiment or every implementation of the present disclosure. The figures and the detailed description below more particularly exemplify illustrative embodiments.

BRIEF DESCRIPTION OF THE DRAWINGS

Throughout the specification reference is made to the appended drawings, where like reference numerals designate like elements, and wherein.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
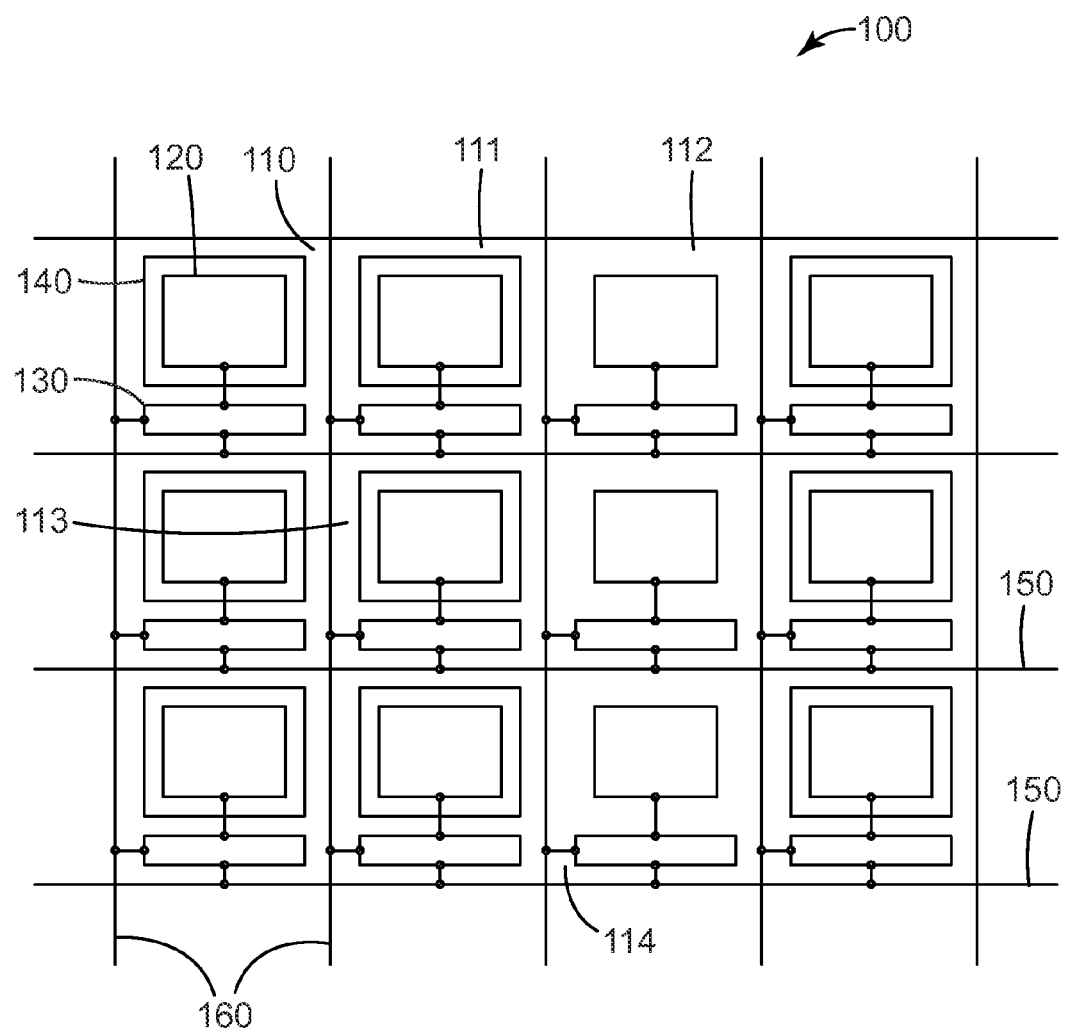
FIG. 1 is a schematic top-view of a light emitting system.

This application describes a pixelated light emitting device that can be used, for example, in a microemissive display. The pixelated light emitting device has improved efficiency of light generation, extraction, and conversion over prior art devices, while simultaneously reducing "optical crosstalk" between pixels. Optical crosstalk generally refers to the light generation in one pixel bleeding through to other pixels in the array. An increase in optical crosstalk can reduce contrast and resolution of a display.

In one embodiment, the pixelated light emitting device comprises an array of electroluminescent pixels, such as an array of light emitting diode (LED). In one particular embodiment, at least a portion of the LED in each pixel of the pixelated light emitting device is shaped as a truncated inverted pyramid in contact with a substrate. The primary light emitting face of the LED is the wider end of the pyramid, facing away from the substrate. The sidewalls of the inverted truncated pyramid forms an angle θ with the substrate, and θ can be selected to maximize light extraction efficiency, while minimizing optical cross talk between pixels. In some cases, the substrate may have absorbing regions between the pixels in order to further reduce optical cross talk. Methods of manufacture of the pixelated light emitting device from a monolithic LED device are also described.

Due to the high refractive index of typical semiconductor LED materials, light rays emitted at a shallow angle with respect to a surface normal of a LED pixel can become trapped within the pixel, resulting in a high probability of becoming absorbed. Trapped light rays can result in a low power efficiency of the LED. Light extraction from an LED can be increased by surface texturing or roughening one or more of the emitting faces. Such "extraction" features are typically 1-5 microns in size, similar to the size of a single pixel for a microemissive display. In one aspect of the disclosure, light extraction is improved from individual pixels without using such micron scale surface texturing or roughening.

Tailoring the shape of a LED pixel improves the power efficiency of the LED pixel, and of the LED array. Shaping an LED die to have with diagonal faces on one or more sides can dramatically improve the light extraction efficiency, especially in a small die. However, merely having high efficiency is often not sufficient for an addressable LED array. Optical power from one LED pixel could be coupled into its neighbors, and light up undesired regions (that is increased crosstalk). We have discovered, surprisingly, that the inverted truncated pyramid shape can also reduce optical crosstalk. A technique is described to determine sidewall angles and shapes to simultaneously minimize optical crosstalk and maximize the efficiency of the device.

This application further teaches light sources that include an array of light emitting regions. The disclosed light sources can efficiently output light at any wavelength in, for example, the visible region of the spectrum. The light sources can be designed to output, for example, one or more primary colors or white light. The light sources can be compact with reduced weight because, for example, the array of light emitting regions can be compactly integrated onto a substrate. The emission efficiency and compactness of the disclosed light sources can lead to new and improved optical systems, such as portable projection systems, with reduced weight, size and power consumption.

The disclosed light sources can have larger and smaller light emitting regions where the output light of each region can be actively and independently controlled. The light sources can be used in, for example, a projection system to illuminate one or more pixelated image forming devices. Each light emitting region of the light source can illuminate a different portion or zone of the image forming device. Such a capability allows for efficient adaptive illumination systems where the output light intensity of a light emitting region of the light source can be actively adjusted to provide the minimum illumination required by a corresponding zone in the image forming device.

The disclosed light sources can form monochromatic (for example, green or green on black) or color images. Such disclosed light sources combine the primary functions of light sources and image forming devices resulting in reduced size, power consumption, cost and the number of element or components used in an optical system that incorporates the disclosed light sources. For example, in a display system, the disclosed light sources can function as both the light source and the image forming device, thereby eliminating or reducing the need for a backlight or a spatial light modulator. As another example, incorporating the disclosed light sources in a projection system eliminates or reduces the need for image forming devices and relay optics.

Arrays of luminescent elements, such as arrays of pixels in a display system, are disclosed in which at least some of the luminescent elements include an electroluminescent element, such an LED, capable of emitting light in response to an electric signal. Some of the luminescent elements include one or more light converting elements, such as one or potential wells and/or quantum wells, for down converting light that is emitted by the electroluminescent elements. As used herein, down converting means that the wavelength of the converted light is greater than the wavelength of the unconverted light.

Arrays of luminescent elements disclosed in this application can be used in illumination systems, such as adaptive illumination systems, for use in, for example, projection systems or other optical systems.

FIG. 1 is a schematic top-view of a light emitting system 100 that includes two or more luminescent elements, such as luminescent elements 110-114. Each luminescent element includes an electroluminescent element that when electrically driven, is capable of emitting light. Each luminescent element further includes a switching circuit for driving the electroluminescent element in the luminescent element. For example, luminescent element 110 includes an electroluminescent element 120 and a switching circuit 130 for driving electroluminescent element 120. In some cases, a luminescent element may include more than one electroluminescent element.

At least one luminescent element in light emitting system 100 includes one or more light converting elements (LCE) for converting light emitted by the electroluminescent element in the luminescent element. For example, luminescent element 110 includes a light converting element 140 capable of converting, such as down converting, light that is emitted by electroluminescent element 120. As another example, luminescent element 112 does not include a light converting element.

Light converting element 140 can include any element capable of receiving light at a first wavelength and converting at least a portion of the received light to light at a second wavelength different than the first wavelength. For example, light converting element 140 can include a phosphor, a fluorescent dye, a conjugated light emitting organic material such as a polyfluorene, a potential well, a quantum well, or a quantum dot. Exemplary phosphors that may be used as a light converting element include strontium thiogallates, doped GaN, copper-activated zinc sulfide, and silver-activated zinc sulfide.

Inorganic potential and quantum wells, such as inorganic semiconductor potential and quantum wells, typically have increased light conversion efficiencies and are more reliable by being less susceptible to environmental elements such as moisture. Furthermore, inorganic potential and quantum wells tend to have narrower output spectrum resulting in, for example, improved color gamut.

As used herein, potential well means semiconductor layer(s) in a multilayer semiconductor structure designed to confine a carrier in one dimension only, where the semiconductor layer(s) has a lower conduction band energy than surrounding layers and/or a higher valence band energy than surrounding layers. Quantum well generally means a potential well which is sufficiently thin that quantization effects increase the energy for electron-hole pair recombination in the well. A quantum well typically has a thickness of about 100 nm or less, or about 10 nm or less.

Electroluminescent element 120 is capable of emitting light in the presence of an electric signal. For example, in some cases, electroluminescent element 120 can emit light when a strong electric field is applied across the device. As another example, electroluminescent element 120 can emit light in response to an electric current passing through the device.

In some cases, electroluminescent element 120 can include a phosphorescent material capable of emitting light when absorbing electrical energy. In some cases, electroluminescent element 120 can include a semiconductor electroluminescent element such as a light emitting diode (LED) or a laser diode.

Light emitting system 100 further includes row enable electrodes 150 and column data electrodes 160 for applying electric signals from an external circuit not shown in FIG. 1 to the switching circuits. In some cases, row enable electrodes 150 are disposed along the rows of the light emitting system for selectively addressing the rows of the light emitting system and column data electrodes 160 are disposed along the columns of the light emitting system for selectively addressing the columns of the light emitting system. In some cases, row enable electrodes 150 and column data electrodes 160 are connected to respective row and column driver circuits not explicitly shown in FIG. 1.

An electroluminescent element in light emitting system 100 can be any device capable of emitting light in response to an electrical signal. For example, an electroluminescent element can be a light emitting diode (LED) capable of emitting photons in response to an electrical current as discussed in, for example, U.S. Patent Publication No. 2006/0124917, entitled "Adapting Short-Wavelength LED's for Polychromatic, Broadband, or 'White' Emission", incorporated herein by reference in its entirety.

An LED electroluminescent element can emit light at any wavelength that may be desirable in an application. For example, the LED can emit light at a UV wavelength, a visible wavelength, or an IR wavelength. In some cases, the LED can be a short-wavelength LED capable of emitting UV photons. In general, the LED and/or a light converting element (LCE) may be composed of any suitable materials, such as organic semiconductors or inorganic semiconductors, including Group IV elements such as Si or Ge; III-V compounds such as InAs, AlAs, GaAs, InP, AlP, GaP, InSb, AlSb, GaSb, GaN, AlN, InN and alloys of III-V compounds such as AlGaInP and AlGaInN; II-VI compounds such as ZnSe, CdSe, BeSe, MgSe, ZnTe, CdTe, BeTe, MgTe, ZnS, CdS, BeS, MgS and alloys of II-VI compounds, or alloys of any of the compounds listed above.

In some cases, the LED can include one or more p-type and/or n-type semiconductor layers, one or more active layers that may include one or more potential and/or quantum wells, buffer layers, substrate layers, and superstrate layers.

In some cases, the LED and/or the LCE can include CdMgZnSe alloys having compounds ZnSe, CdSe, and MgSe as the three constituents of the alloy. In some cases, one or more of Cd, Mg, and Zn, especially Mg, may have zero concentration in the alloy and therefore, may be absent from the alloy. For example, the LCE can include a $Cd_{0.70}Zn_{0.30}Se$ quantum well capable of emitting in the red, or a $Cd_{0.33}Zn_{0.67}Se$ quantum well capable of emitting in the green. As another example, the LED and/or the LCE can include an alloy of Cd, Zn, Se, and optionally Mg, in which case, the alloy system can be represented by Cd(Mg)ZnSe. As another example, the LED and/or the LCE can include an alloy of Cd, Mg, Se, and optionally Zn. In some cases, a quantum well LCE has a thickness in a range from about 1 nm to about 100 nm, or from about 2 nm to about 35 nm.

In some cases, a semiconductor LED or LCE may be n-doped or p-doped where the doping can be accomplished by any suitable method and by inclusion of any suitable dopant. In some cases, the LED and the LCE are from the same semiconductor group. In some cases, the LED and the LCE are from two different semiconductor groups. For example, in some cases, the LED is a III-V semiconductor device and the LCE is a II-VI semiconductor device. In some cases, the LEDs include AlGaInN semiconductor alloys and the LCEs include Cd(Mg)ZnSe semiconductor alloys.

An LCE can be disposed on or attached to a corresponding electroluminescent element by any suitable method such as by an adhesive such as a hot melt adhesive, welding, pressure, heat or any combinations of such methods. Examples of suitable hot melt adhesives include semicrystalline polyolefins, thermoplastic polyesters, and acrylic resins.

In some cases, an LCE can be attached to a corresponding electroluminescent element by a wafer bonding technique. For example, the uppermost surface of the electroluminescent element and the lowermost surface of the LCE can be coated with a thin layer of silica or other inorganic materials using, for example, a plasma assisted or conventional CVD process. Next, the coated surfaces can be optionally planarized and bonded using a combination of heat, pressure, water, or one or more chemical agents. The bonding can be improved by bombarding at least one of the coated surfaces with hydrogen atoms or by activating the surface using a low energy plasma. Wafer bonding methods are described in, for example, U.S. Pat. Nos. 5,915,193 and 6,563,133, and in chapters 4 and 10 of "Semiconductor Wafer Bonding" by Q.-Y. Tong and U. Gösele (John Wiley & Sons, New York, 1999).

In some cases, a quantum or potential well LCE can have one or more light absorbing layers proximate the well to assist in absorbing light emitted from a corresponding electroluminescent element. In some cases, the absorbing layers are composed of materials in which photogenerated carriers can efficiently diffuse to the potential well. In some cases, the light absorbing layers can include a semiconductor, such as an inorganic semiconductor. In some cases, a quantum or potential well LCE can include buffer layers, substrate layers, and superstrate layers.

An electroluminescent element or an LCE can be manufactured by any suitable method. For example, a semiconductor electroluminescent element and/or LCE can be manufactured using molecular beam epitaxy (MBE), chemical vapor deposition (CVD), liquid phase epitaxy (LPE) or vapor phase epitaxy (VPE).

Light emitting system 100 enables direct creation of images at very small sizes where the brightness of each luminescent element or pixel can be independently controlled. Alternatively, the light emitting system can be used for "zone illumination" of image forming devices, thereby allowing for reduced power consumption by darkening or reducing the brightness of emitting system pixel(s) that correspond to a dark area of an ultimate image. The ability to provide a highly controllable lighting source provides a large advantage in conserving energy as well as minimizing the size of the optical systems, such as projection systems, that utilize the light emitting system.

Figure 2:
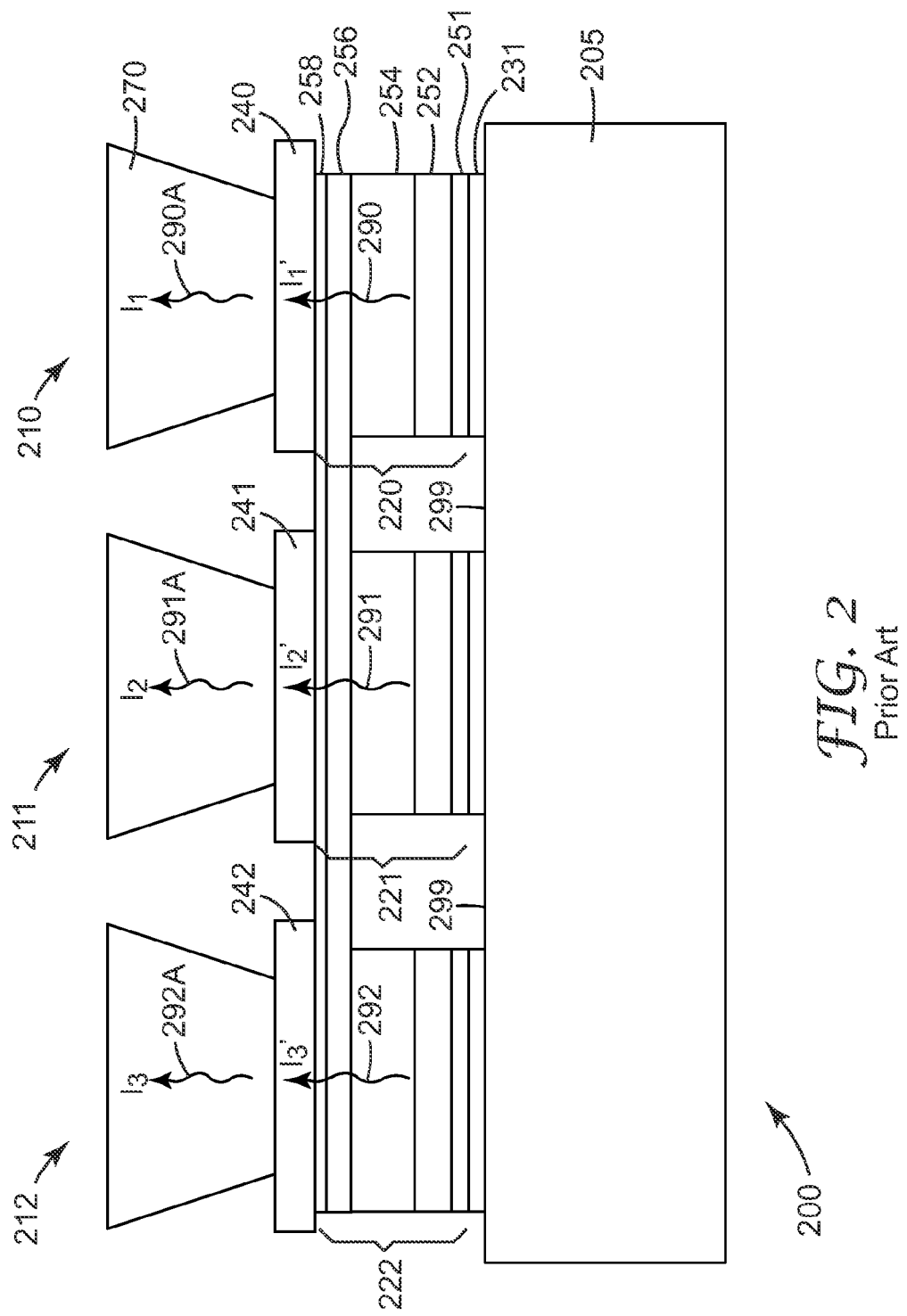
FIG. 2 is a schematic side-view of a prior art light emitting system.

FIG. 2 is a schematic side-view of a prior art light emitting system 200 that includes an array of luminescent elements, such as luminescent elements 210-212, disposed on a common substrate 205. Further description of the light emitting system 200 and methods of making the light emitting system 200 shown in FIG. 2 can be found, for example, in Published PCT Application WO 2008/109296, entitled ARRAY OF LUMINESCENT ELEMENTS. At least a portion of a surface 299 of the common substrate 205 is exposed between each of the luminescent elements 210-212. Each luminescent element includes an electroluminescent element and a switching circuit for driving the electroluminescent element. For example, luminescent element 210 includes an electroluminescent element 220 and a switching circuit 231 for driving electroluminescent element 220, where the switching circuit can include one or more transistors. Electroluminescent element 220 includes a first electrode 251, a p-type semiconductor layer 252, an optional semiconductor active layer 254, an n-type semiconductor layer 256, and an optional second electrode 258.

First electrode 251 is designed to provide ohmic contact with and spread electrical current through p-type layer 252. Optional active layer 254 is typically a semiconductor layer, typically a multiple-quantum-well layer, for radiative recombination of electron-hole pairs injected from p-type layer 252 and n-type layer 256.

In some cases, such as when n-type layer 256 is sufficiently conductive to adequately spread an electrical current flowing through the n-type layer, second electrode 258 may be formed, for example, at a periphery of the electroluminescent element or the light emitting system.

In the exemplary light emitting system 200, n-type layer 256 extends across luminescent elements 210-212, meaning that n-type layer 256 forms a continuous layer across luminescent elements 210-212. In general, a semiconductor layer in a luminescent element may or may not extend across other luminescent elements. For example, in some cases, each luminescent element can have a discrete n-type layer 256.

Luminescent element 210 further includes a light converting element for converting light emitted by electroluminescent element 220. In general, at least one luminescent element in light emitting system 200 includes a light converting element, such as a potential well or a quantum well, for converting, such as down converting, light emitted by the electroluminescent element in the luminescent element. In some cases, each luminescent element in light emitting system 200 includes a light converting element.

In the exemplary light emitting system 200, luminescent element 210 includes a light converting element (LCE) 240 disposed on electroluminescent element 220, luminescent element 211 includes a light converting element 241 disposed on an electroluminescent element 221, and luminescent element 212 includes a light converting element 242 disposed on an electroluminescent element 222.

In some cases, luminescent element 210 is capable of outputting light 290A at a first wavelength $\lambda_1$, luminescent element 211 is capable of outputting light 291A at a second wavelength $\lambda_2$, and luminescent element 212 is capable of outputting light 292A at a third wavelength $\lambda_3$. In some cases, wavelength $\lambda_2$ is different from $\lambda_1$ and wavelength $\lambda_3$ is different from $\lambda_1$ and $\lambda_2$.

In some cases, electroluminescent element 220 is capable of emitting light 290 at $\lambda_1'$, electroluminescent element 221 is capable of emitting light 291 at $\lambda_2'$, and electroluminescent element 222 is capable of emitting light 292 at $\lambda_3'$. In some cases, wavelength $\lambda_2'$ is different from $\lambda_1'$ and wavelength $\lambda_3'$ is different from $\lambda_1'$ and $\lambda_2'$. In some cases, wavelength $\lambda_1'$ is different from wavelength $\lambda_1$, wavelength $\lambda_2'$ is different from wavelength $\lambda_2$, and wavelength $\lambda_3'$ is different from wavelength $\lambda_3$. In such cases, light converting element 240 converts at least a portion of light 290 at wavelength $\lambda_1'$ to light 290A at wavelength $\lambda_1$, light converting element 241 converts at least a portion of light 291 at wavelength $\lambda_2'$ to light 291A at wavelength $\lambda_2$, and light converting element 242 converts at least a portion of light 292 at wavelength $\lambda_3'$ to light 292A at wavelength $\lambda_3$.

In some cases, the light outputted by luminescent element 210 may simply be the light emitted by electroluminescent element 220. In such cases, wavelengths $\lambda_1$ and $\lambda_1'$ are substantially the same. In such cases, LCE 240 is eliminated from luminescent element 210 and may, for example, be replaced with an equally thick transparent element, for example, to assist in planarizing the light emitting system.

In general, light converting element 240 can be any element capable of converting at least a portion of light from a first wavelength to a second wavelength different from the first wavelength. In some cases, light converting element 240 can be a photoluminescent element capable of converting light by absorption and photoluminescence. In some cases, a photoluminescent element can include one or more potential and/or quantum wells.

In some cases, the light converting element can include a potential well. In general, the potential well can have any conduction and/or valence band profile. Some exemplary conduction band profiles for a potential well are described, for example, in Published PCT Patent Application WO 2008/109296, entitled ARRAY OF LUMINESCENT ELEMENTS.

Referring back to FIG. 2, in some cases, wavelengths $\lambda_1'$, $\lambda_2'$, and $\lambda_3'$ may be in the same region of the spectrum, such as the blue, violet, or UV region of the spectrum. In some cases, wavelengths $\lambda_1'$, $\lambda_2'$, and $\lambda_3'$ may be substantially the same. For example, wavelengths $\lambda_1'$, $\lambda_2'$, and $\lambda_3'$ may be substantially the same wavelength in the blue, violet, or UV region of the spectrum.

In some cases, $\lambda_1'$, $\lambda_2'$, and $\lambda_3'$ are substantially the same wavelength, wavelength $\lambda_1$ is substantially the same as $\lambda_1'$, wavelength $\lambda_2$ is different from $\lambda_2'$, and wavelength $\lambda_3$ is different from $\lambda_3'$. For example, wavelengths $\lambda_1$, $\lambda_1'$, $\lambda_2'$, and $\lambda_3'$ can all be about 460 nm (blue), $\lambda_2$ can be about 540 nm (green), and $\lambda_3$ can be about 630 nm (red). In some cases, $\lambda_1$, $\lambda_1'$, $\lambda_2'$, and $\lambda_3'$ are in the same first region of the spectrum, such as the blue region of the spectrum; wavelength $\lambda_2$ is in a second region of the spectrum different from the first region, such as the green region of the spectrum; and wavelength $\lambda_3$ is in a third region of the spectrum different from the first and second regions, such as the red region of the spectrum.

In some cases, light converting element 240 may convert light at wavelength $\lambda_1'$ to light at wavelength $\lambda_1$ by first converting light at wavelength $\lambda_1'$ to a third wavelength.

In some cases, different luminescent elements in light emitting system 200 of FIG. 2 may output light at more than three different regions in the visible spectrum. For example, the luminescent elements may output light at five different regions in the visible spectrum, for example, to improve color properties of the overall light outputted by the light emitting system. For example, some luminescent elements may output blue light; some luminescent elements may output cyan light, for example, at about 500 nm; some luminescent elements may output green light; some luminescent elements may output yellow or orange light; and some luminescent elements may output red light.

In some cases, a cyan output light can be achieved by using a potential well capable of re-emitting cyan light, or by combining the output of two potential wells where the first potential well is capable of re-emitting, for example, at about 460 nm and the second potential well is capable of re-emitting, for example, at about 540 nm.

In some cases, a magenta output light can be achieved by combining the output of two potential wells where the first potential well is capable of re-emitting, for example, at about 460 nm and the second potential well is capable of re-emitting, for example, at about 630 nm.

Luminescent element 210 in FIG. 2 further includes a light extractor 270 for extracting light from one or layers, such as layer 240, disposed below the light extractor. In general, light can be extracted by any means suitable in an application. For example, light can be extracted by encapsulation where the encapsulating element can, for example, have a hemispherical profile for partially collimating the extracted light. Light can also be extracted by patterning or texturing, for example roughening, the top and/or lower surfaces of one or more layers in the luminescent element. As another example, light can be extracted by forming a photonic crystal on the exterior surface of a light converting element and/or an electroluminescent element and/or other layers in the luminescent element. Exemplary photonic crystals are described in, for example, U.S. Pat. Nos. 6,987,288 and 7,161,188. In some cases, light can be extracted by forming an optical element, such as light extractor 270, on the output surface. Light extractor 270 can be any element and can have any shape capable of extracting at least a portion of light that would otherwise not exit the luminescent element due to, for example, total internal reflection. Exemplary light extractors are described in, for example, commonly-owned U.S. Published Patent Application No. US2007/0284565, titled "LED Device with Re-emitting Semiconductor Construction and Optical Element"; commonly-owned PCT Published Patent Application No. WO2008064068, titled "Planarized LED with Optical Extractor"; and commonly-owned U.S. Published Patent Application No. US 2007/0284603, titled "LED Device with Re-emitting Semiconductor Construction and Converging Optical Element", the entirety of which are incorporated herein by reference.

In some cases, a luminescent element can have a dedicated light extractor. In some cases, a light extractor may extend beyond a luminescent element. For example, in some cases, a light extractor may extend across two or more luminescent elements.

In general, light extractor 270 is optically transparent and, in some cases, has a relatively high refractive index. Exemplary materials for the extractor include inorganic materials such as high index glasses (for example, Schott glass type LASF35, available from Schott North America, Inc., Elmsford, N.Y. under a trade name LASF35) and ceramics (for example, sapphire, zinc oxide, zirconia, diamond, and silicon carbide). Exemplary useful glasses are described in commonly assigned U.S. patent application Ser. No. 11/381,518 entitled "LED Extractor Composed Of High Index Glass" incorporated herein by reference. Sapphire, zinc oxide, diamond, and silicon carbide are particularly useful ceramic materials since these materials also have a relatively high thermal conductivity (0.2-5.0 W/cm K). In some cases, light extractor 270 includes high index polymers or nano-particle filled polymers, where the polymers can be, for example, thermoplastic and/or thermosetting. In some cases, thermoplastic polymers can include polycarbonate and cyclic olefin copolymers. In some cases, thermosetting polymers can be, for example, acrylics, epoxy, silicones, or others known in the art. Exemplary ceramic nano-particles include zirconia, titania, zinc oxide, and zinc sulfide.

Light extractor 270 can be manufactured by conventional techniques, such as machining or molding, or by using precision abrasive techniques disclosed in commonly assigned U.S. Patent Publication No. 2006/0094340A1, entitled "Process For Manufacturing Optical And Semiconductor Elements"; U.S. Patent Publication No. 2006/0094322A1, entitled "Process For Manufacturing A Light Emitting Array"; and U.S. patent application Ser. No. 11/288,071, entitled "Arrays Of Optical Elements And Method Of Manufacturing Same" the entirety of which are incorporated herein by reference. Other exemplary manufacturing techniques are described in commonly assigned U.S. patent application Ser. No. 11/381,512, entitled "Methods Of Making LED Extractor Arrays" incorporated herein by reference.

In some cases, the luminescent elements in light emitting system 200 of FIG. 2 are configured as an active matrix array. In such cases, each luminescent element in the light emitting system includes a dedicated switching circuit for driving the electroluminescent element within the luminescent element. For example, luminescent element 210 includes switching circuit 231 that may include one or more transistors not shown in FIG. 2.

In some cases, the luminescent elements in light emitting system 200 are configured as a passive matrix array. In such cases, no luminescent element in the light emitting system has a dedicated switching circuit. In some cases, the p-type electrodes are connected to form rows and the n-type electrodes are connected to form columns.

Substrate 205 can include any material that may be suitable in an application. For example, substrate 205 may include or be made of Si, Ge, GaAs, GaN, InP, sapphire, SiC and ZnSe. In some cases, substrate 205 may be n-doped, p-doped, insulating, or semi-insulating, where the doping may be achieved by any suitable method and/or by inclusion of any suitable dopant.

In some cases, light emitting system 200 does not include a substrate 205. For example, various elements of light emitting system 200 may be formed on substrate 205 and then separated from the substrate by, for example, etching or ablation.

Figure 3:
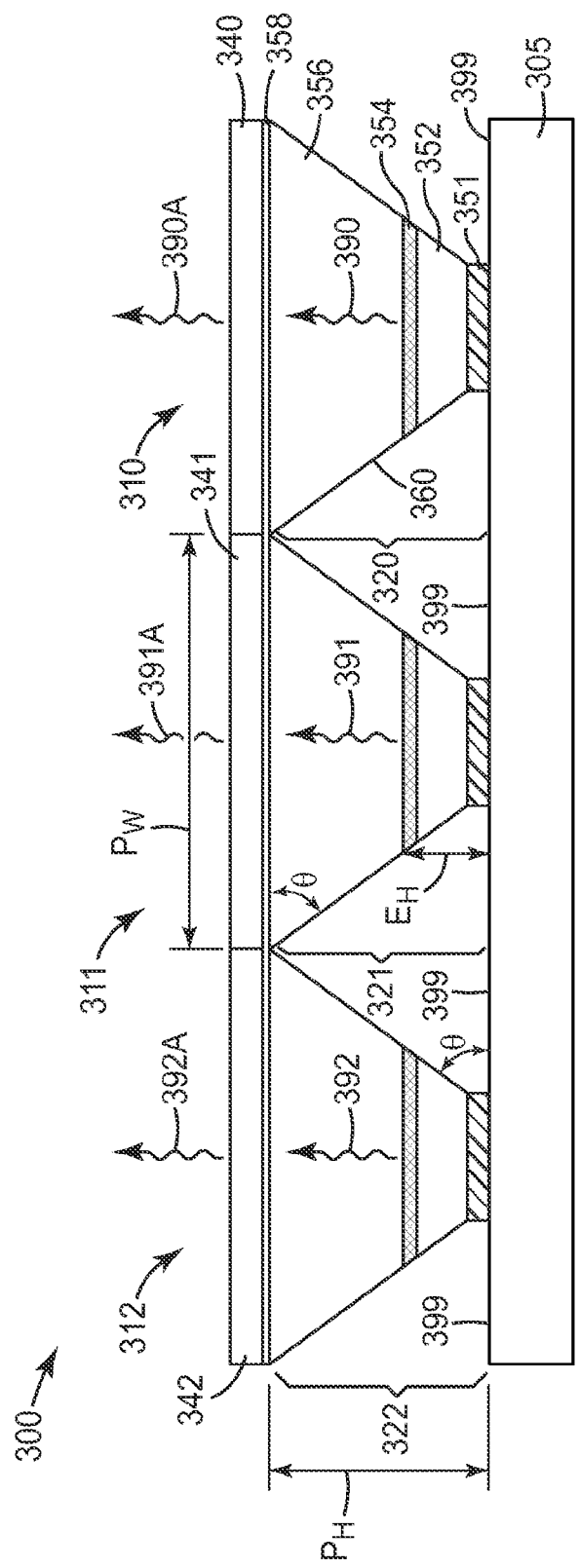
FIG. 3 is a schematic side-view of a pixelated LED.

FIG. 3 is a schematic side-view of a pixelated LED 300 that includes an array of luminescent elements, such as luminescent elements 310-312, disposed on a common substrate 305. At least a portion of a surface 399 of the common substrate 305 is exposed between each of the luminescent elements 310-312. The portion of a surface 399 of the common substrate 305 that is exposed can include a coating or a surface treatment such as, for example, a light absorbing coating or a surface texture that can reduce reflections. Each of the luminescent elements 310-312 includes a pixel height ($P_H$) defined by the separation between the surface 399 of substrate 305 and a second electrode 358. Each of the luminescent elements 310-312 further includes a pixel width ($P_W$) which is coincident with the light emission region of the luminescent element. In one particular embodiment, the pixel height ($P_H$) ranges from about 0.5 µm to about 10 µm, from about 1.0 um to about 5 um, or from about 1.0 um to about 3 um. In one particular embodiment, the pixel width ($P_W$) ranges from about 0.5 µm to about 10 µm, from about 1 µm to about 5 µm, or from about 1 µm to about 3 µm. The light emission region of the luminescent element (that is, the pixel) can have any desired shape; however, a square or rectangular shape is preferred.

In the description that follows, the materials used for each of the substrate 305, luminescent elements (310, 311, 312), electroluminescent elements (320, 321, 322), and optional LCEs (340, 341, 342) can be the same as described for the substrate 205, luminescent elements (210, 211, 212), electroluminescent elements (220, 221, 222), and LCEs (240, 241, 242), respectively, as those described in FIG. 2. It is to be appreciated that the shape of each electroluminescent element of the present disclosure is different from the prior art device described in FIG. 2, however the materials used within each device can be the same. Additionally, as described elsewhere, the relative positioning of the layers within the electroluminescent elements of the present disclosure, can be different from the relative positioning of the layers in the prior art device described in FIG. 2.

Each of the luminescent elements 310, 311, 312, is fabricated simultaneously from a monolithic electroluminescent material, as will be described elsewhere. As a result, each of the luminescent elements 310, 311, 312 have a similar structure, so only luminescent element 310 will be described, for brevity. Each luminescent element includes an electroluminescent element 320-322 and a switching circuit (not shown) for driving the device, similar to the description of the switching circuit provided in FIG. 2. The following description can be applied in a like manner for each of the other luminescent elements in the array.

Luminescent element 310 includes electroluminescent element 320 having a first electrode 351 disposed adjacent the substrate 305. Each first electrode 351 is separated from an adjacent first electrode 351 by a surface 399 of substrate 305. In one particular embodiment, surface 399 of substrate 305 can absorb a portion of incident visible light. First electrode 351 can include connections (not shown) for addressing luminescent element 310 in an active or passive manner, as described elsewhere. Generally, first electrode 351 includes a metal having a high reflectivity for visible light, such as silver or a silver alloy. A p-doped semiconductor 352 is disposed in ohmic contact adjacent the first electrode 351. An n-doped semiconductor 356 is disposed adjacent the p-doped semiconductor 352, and opposite the substrate 305. An emissive region 354 is disposed between the p-doped semiconductor 352 and the n-doped semiconductor 356. The emissive region 354, where holes and electrons combine to generate light, can include an optional semiconductor active area such as the optional semiconductor active area 254 described with reference to FIG. 2.

First electrode 351 is designed to provide ohmic contact with and spread electrical current through p-type layer 352. Emissive region 354 is typically a semiconductor layer, typically a multiple-quantum-well layer, for radiative recombination of electron-hole pairs injected from p-type layer 352 and n-type layer 356.

The emissive region 354 can be positioned parallel to the surface 399 of substrate 305 at an emissive region height ($E_H$) from the surface 399. Although the emissive region height can theoretically range from $E_H=0$ to $E_H=P_H$, it has been discovered that the emissive region 354 preferably is positioned closer to the first electrode 351 than to the second electrode 358. Positioning the emissive region 354 closer to the first electrode 351 generally increases the efficiency of the electroluminescent element 320. In one particular embodiment, the emissive region height ($E_H$) ranges from about 100 nm to about 500 nm, from about 150 nm to about 250 nm, or from about 175 nm to about 225 nm.

In some cases, such as when n-type layer 356 is sufficiently conductive to adequately spread an electrical current flowing through the n-type layer, second electrode 358 may be formed, for example, at a periphery of the electroluminescent element or the light emitting system.

In an exemplary pixelated LED 300, n-type layer 356 extends across luminescent elements 310-312, meaning that at least a portion of the n-type layer 356 forms a continuous layer across luminescent elements 310-312. In general, a semiconductor layer in a luminescent element may or may not extend across other luminescent elements. For example, in some cases, each luminescent element can have a discrete n-type layer 356.

Luminescent element 310 further includes an optional light converting element 340 for converting light emitted by electroluminescent element 320. In general, at least one luminescent element in pixelated LED 300 includes a light converting element, such as a potential well or a quantum well, for converting, such as down converting, light emitted by the electroluminescent element in the luminescent element. In some cases, each luminescent element in pixelated LED 300 includes a light converting element.

In one particular embodiment of the pixelated LED 300, luminescent element 310 includes a light converting element 340 disposed on electroluminescent element 320, luminescent element 311 includes a light converting element 341 disposed on an electroluminescent element 321, and luminescent element 312 includes a light converting element 342 disposed on an electroluminescent element 322.

In some cases, luminescent element 310 is capable of outputting light 390A at a first wavelength $\lambda_1$, luminescent element 311 is capable of outputting light 391A at a second wavelength $\lambda_2$, and luminescent element 312 is capable of outputting light 392A at a third wavelength $\lambda_3$. In some cases, wavelength $\lambda_2$ is different from $\lambda_1$ and wavelength $\lambda_3$ is different from $\lambda_1$ and $\lambda_2$.

In some cases, electroluminescent element 320 is capable of emitting light 390 at $\lambda_1'$, electroluminescent element 321 is capable of emitting light 391 at $\lambda_2'$, and electroluminescent element 322 is capable of emitting light 392 at $\lambda_3'$. In some cases, wavelength $\lambda_2'$ is different from $\lambda_1'$ and wavelength $\lambda_3'$ is different from $\lambda_1'$ and $\lambda_2'$. In some cases, wavelength $\lambda_1'$ is different from wavelength $\lambda_1$, wavelength $\lambda_2'$ is different from wavelength $\lambda_2$, and wavelength $\lambda_3'$ is different from wavelength $\lambda_3$. In such cases, light converting element 340 converts at least a portion of light 390 at wavelength $\lambda_1'$ to light 390A at wavelength $\lambda_1$, light converting element 341 converts at least a portion of light 391 at wavelength $\lambda_2'$ to light 391A at wavelength $\lambda_2$, and light converting element 342 converts at least a portion of light 392 at wavelength $\lambda_3'$ to light 392A at wavelength $\lambda_3$.

In some cases, the light outputted by luminescent element 310 may simply be the light emitted by electroluminescent element 320. In such cases, wavelengths $\lambda_1$ and $\lambda_1'$ are substantially the same. In such cases, LCE 340 is eliminated from luminescent element 310 and may, for example, be replaced with an equally thick transparent element, for example, to assist in planarizing the light emitting system. In general, light converting element 340 can be any element capable of converting at least a portion of light from a first wavelength to a second wavelength different from the first wavelength. In some cases, light converting element 340 can be a photoluminescent element capable of converting light by absorption and photoluminescence. In some cases, a photoluminescent element can include one or more potential and/or quantum wells.

In some cases, the light converting element can include a potential well. In general, the potential well can have any conduction and/or valence band profile. Some exemplary conduction band profiles for a potential well are described, for example, in Published PCT Patent Application WO 2008/109296, entitled ARRAY OF LUMINESCENT ELEMENTS.

Referring back to FIG. 3, in some cases, wavelengths $\lambda_1'$, $\lambda_2'$, and $\lambda_3'$ may be in the same region of the spectrum, such as the blue, violet, or UV region of the spectrum. In some cases, wavelengths $\lambda_1'$, $\lambda_2'$, and $\lambda_3'$ may be substantially the same. For example, wavelengths $\lambda_1'$, $\lambda_2'$, and $\lambda_3'$ may be substantially the same wavelength in the blue, violet, or UV region of the spectrum. In one particular embodiment, wavelengths $\lambda_1'$, $\lambda_2'$, and $\lambda_3'$ may be substantially the same wavelength, as a result of the process for making the pixelated LED 300 from a monolithic electroluminescent material, as described elsewhere.

In some cases, $\lambda_1'$, $\lambda_2'$, and $\lambda_3'$ are substantially the same wavelength, wavelength $\lambda_1$ is substantially the same as $\lambda_1'$, wavelength $\lambda_2$ is different from $\lambda_2'$, and wavelength $\lambda_3$ is different from $\lambda_3'$. For example, wavelengths $\lambda_1$, $\lambda_1'$, $\lambda_2'$, and $\lambda_3'$ can all be about 460 nm (blue), $\lambda_2$ can be about 540 nm (green), and $\lambda_3$ can be about 630 nm (red). In some cases, $\lambda_1$, $\lambda_1'$, $\lambda_2'$, and $\lambda_3'$ are in the same first region of the spectrum, such as the blue region of the spectrum; wavelength $\lambda_2$ is in a second region of the spectrum different from the first region, such as the green region of the spectrum; and wavelength $\lambda_3$ is in a third region of the spectrum different from the first and second regions, such as the red region of the spectrum.

In some cases, light converting element 340 may convert light at wavelength $\lambda_1'$ to light at wavelength $\lambda_1$ by first converting light at wavelength $\lambda_1'$ to a third wavelength.

In some cases, different luminescent elements in pixelated LED 300 of FIG. 3 may output light at more than three different regions in the visible spectrum. For example, the luminescent elements may output light at five different regions in the visible spectrum, for example, to improve color properties of the overall light outputted by the light emitting system. For example, some luminescent elements may output blue light; some luminescent elements may output cyan light, for example, at about 500 nm; some luminescent elements may output green light; some luminescent elements may output yellow or orange light; and some luminescent elements may output red light.

In some cases, a cyan output light can be achieved by using a potential well capable of re-emitting cyan light, or by combining the output of two potential wells where the first potential well is capable of re-emitting, for example, at about 460 nm and the second potential well is capable of re-emitting, for example, at about 540 nm.

In some cases, a magenta output light can be achieved by combining the output of two potential wells where the first potential well is capable of re-emitting, for example, at about 460 nm and the second potential well is capable of re-emitting, for example, at about 630 nm.

Luminescent element 310 in FIG. 3 can optionally include a light extractor (not shown) for extracting light from one or more layers, similar to the light extractors 270 described in FIG. 2. Generally, however, such light extractors are not required in embodiments of the present disclosure. Exemplary light extractors have been described elsewhere, with reference to FIG. 2.

In some cases, the luminescent elements in pixelated LED 300 of FIG. 3 are configured as an active matrix array. In such cases, each luminescent element in the light emitting system includes a dedicated switching circuit for driving the electroluminescent element within the luminescent element.

In some cases, the luminescent elements in pixelated LED 300 are configured as a passive matrix array. In such cases, no luminescent element in the light emitting system has a dedicated switching circuit. In some cases, the p-type electrodes are connected to form rows and the n-type electrodes are connected to form columns.

Substrate 305 can include any material that may be suitable in an application. For example, substrate 305 may include or be made of Si, Ge, GaAs, GaN, InP, sapphire, SiC and ZnSe. In some cases, substrate 305 may be n-doped, p-doped, insulating, or semi-insulating, where the doping may be achieved by any suitable method and/or by inclusion of any suitable dopant.

In some cases, pixelated LED 300 does not include a substrate 305. For example, various elements of pixelated LED 300 may be formed on substrate 305 and then separated from the substrate by, for example, etching or ablation.

In one particular embodiment, the electroluminescent element 320 has sidewalls 360 that collectively form a shape similar to an inverted truncated pyramid, as shown in cross-section in FIG. 3. It has been discovered that an electroluminescent element 320 having sidewalls 360 that are sloped at an angle θ can effectively reduce the amount of crosstalk that can occur between devices, as well as improve the efficiency of each individual device. In one particular embodiment, the sidewall angle θ can range from about 15 degrees to about 85 degrees, from about 30 degrees to about 80 degrees, or from about 45 degrees to about 75 degrees.

Although each sidewall 360 of electroluminescent element 320 is shown to have a continuous smooth surface forming the angle θ with the substrate, it is to be understood that the sidewall 360 may instead have undulations that deviate from a continuous smooth surface. These undulations can be a result of the process for shaping the electroluminescent element 320, discussed elsewhere. In other embodiments, the electroluminescent element 320 can have sidewalls 360 that are curved, or even have stepwise discontinuities, as described elsewhere.

Figure 4:
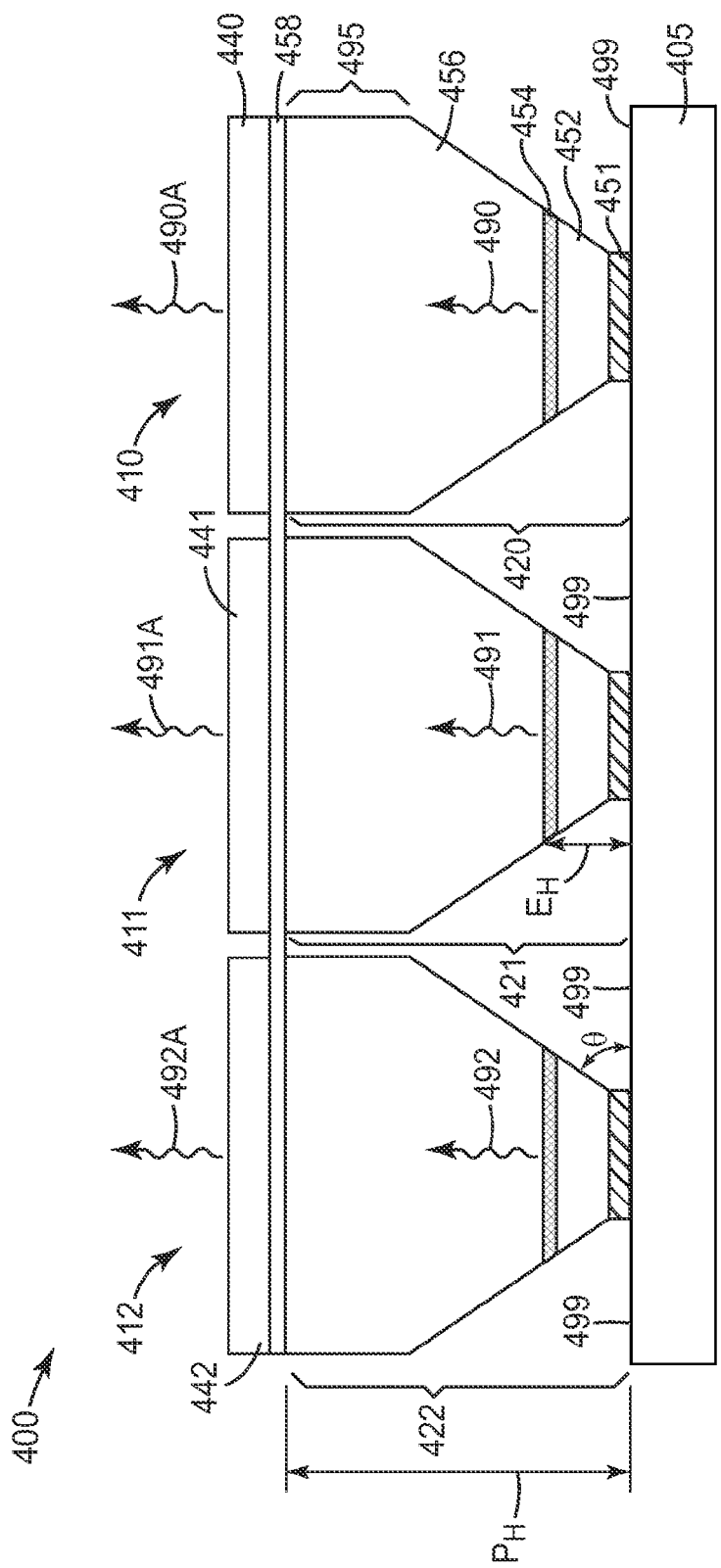
FIG. 4 is a schematic side-view of a pixelated LED.

FIG. 4 is a schematic side-view of a pixelated LED 400 that includes an array of luminescent elements, such as luminescent elements 410-412, disposed on a common substrate 405. Each of the elements 405-499 shown in FIG. 4 correspond to like-numbered elements 305-399 shown in FIG. 3, which have been described previously. For example, the description of substrate 405 in FIG. 4 corresponds to the description of substrate 305 in FIG. 3, and so on. FIG. 4 illustrates one particular embodiment of the shaped electroluminescent element 420-422, where only a portion of the electroluminescent element 420-422 includes an inverted trapezoidal shape. FIG. 4 also illustrates an embodiment where there is a separation distance "d" between adjacent luminescent elements 410-412.

A first portion 494 of electroluminescent element 420 includes sidewalls 460 that collectively form an approximate inverted trapezoidal shape immediately adjacent the surface 499 of substrate 405. Each of the sidewalls 460 in the first portion 494 forms an angle θ with the surface 499. A second portion 495 of the electroluminescent element 420 includes sidewall 460 that forms an approximately 90 degree angle to the surface 499 of substrate 405. Each of the luminescent elements 410-412 can be separated from each other by a distance "d", however, in some cases, the second portion 495 of adjacent electroluminescent elements can be a continuous layer, and the separation distance "d" is zero. Although including a second portion 495 of the electroluminescent element 420 may increase "crosstalk" between adjacent luminescent elements 410-412, in some cases the pixelated LED 400 may be more easily fabricated than the pixelated LED 300 shown in FIG. 3, as will be described elsewhere.

Figure 5:
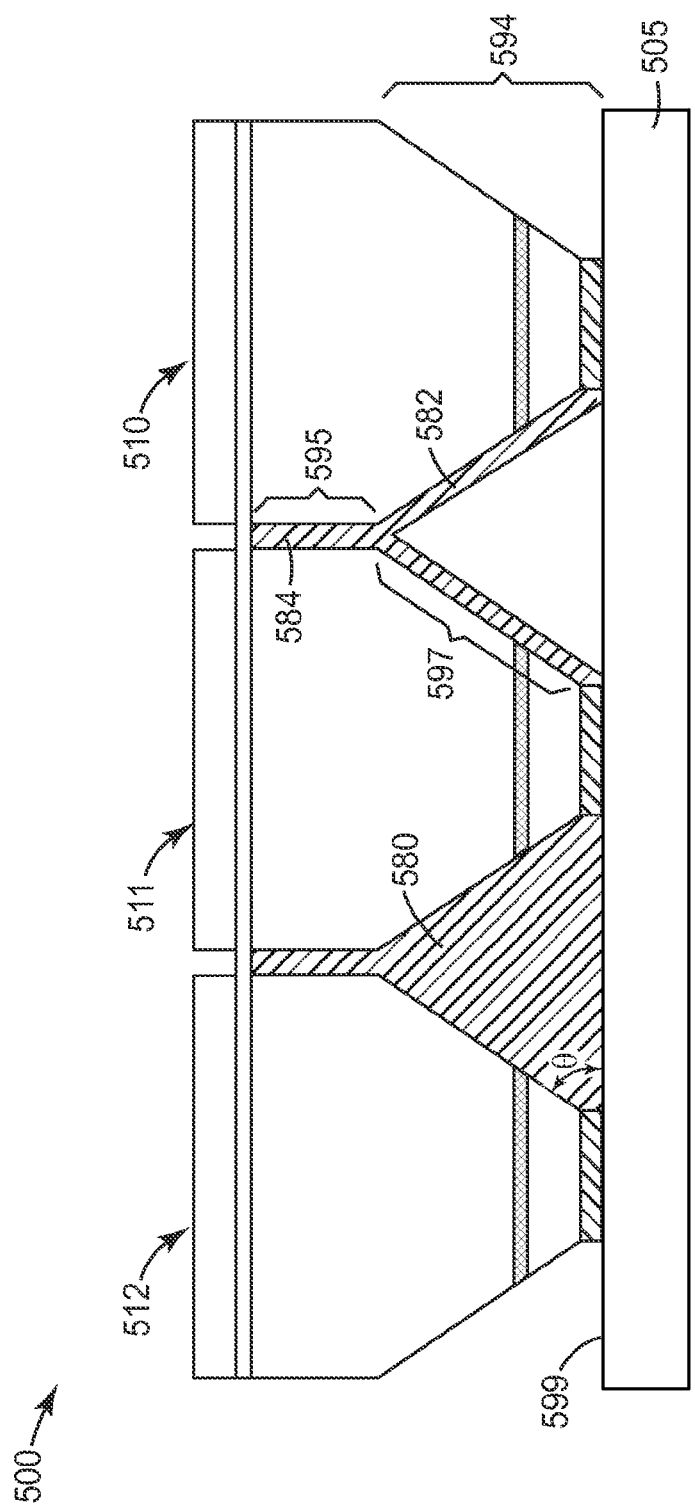
FIG. 5 is a schematic side-view of a pixelated LED.

FIG. 5 is a schematic side-view of a pixelated LED 500 that includes an array of luminescent elements, such as luminescent elements 510-512, disposed on a common substrate 505. Each of the elements 505-599 shown in FIG. 5 correspond to like-numbered elements 405-499 shown in FIG. 4, which have been described previously. For example, the description of substrate 505 in FIG. 5 corresponds to the description of substrate 405 in FIG. 4, and so on. FIG. 5 illustrates one particular embodiment of the pixelated LED 400 of FIG. 4, where portions of the space between adjacent electroluminescent elements are filled with a material that can further reduce crosstalk and improve efficiency, by isolating the luminescent elements 510-512 from one another.

In one particular embodiment, an isolating material 580 can fill the entire region between neighboring electroluminescent elements, for example, as shown between electroluminescent elements 511 and 512 in FIG. 5. In another particular embodiment, an isolating material 584 can fill the region adjacent the second portion 595 of the corresponding electroluminescent elements, for example, as shown between luminescent element 510 and 511. In another particular embodiment, an isolating material 582 can also be disposed adjacent the first portion 594 of the corresponding electroluminescent elements, for example, the sidewall portions 597 of neighboring luminescent elements 510 and 511, as shown in FIG. 5.

The isolating material 580, 582, 584 can be any material or combination of materials that provide optical isolation between neighboring luminescent elements, yet does not provide an electrically conductive path along the sidewall portions 597 of the luminescent elements. In one particular embodiment, the isolating material 580, 582, 584 can be a low refractive index dielectric material, such as a polymer or silicon dioxide (silica). In another particular embodiment, the isolating material 580, 582, 584 can include more than one layer of material. For example, a first layer immediately adjacent the sidewall portions 597 can be a low index dielectric such as silica, and a second layer can be a reflective material such as aluminum or silver. In some cases it may be desirable for the isolating material to have approximately the same coefficient of thermal expansion (CTE) as that of the luminescent elements. In other cases, the isolating material may be selected such that the volume averaged composite CTE is approximately the same as the substrate and/or the luminescent element.

Figure 6:
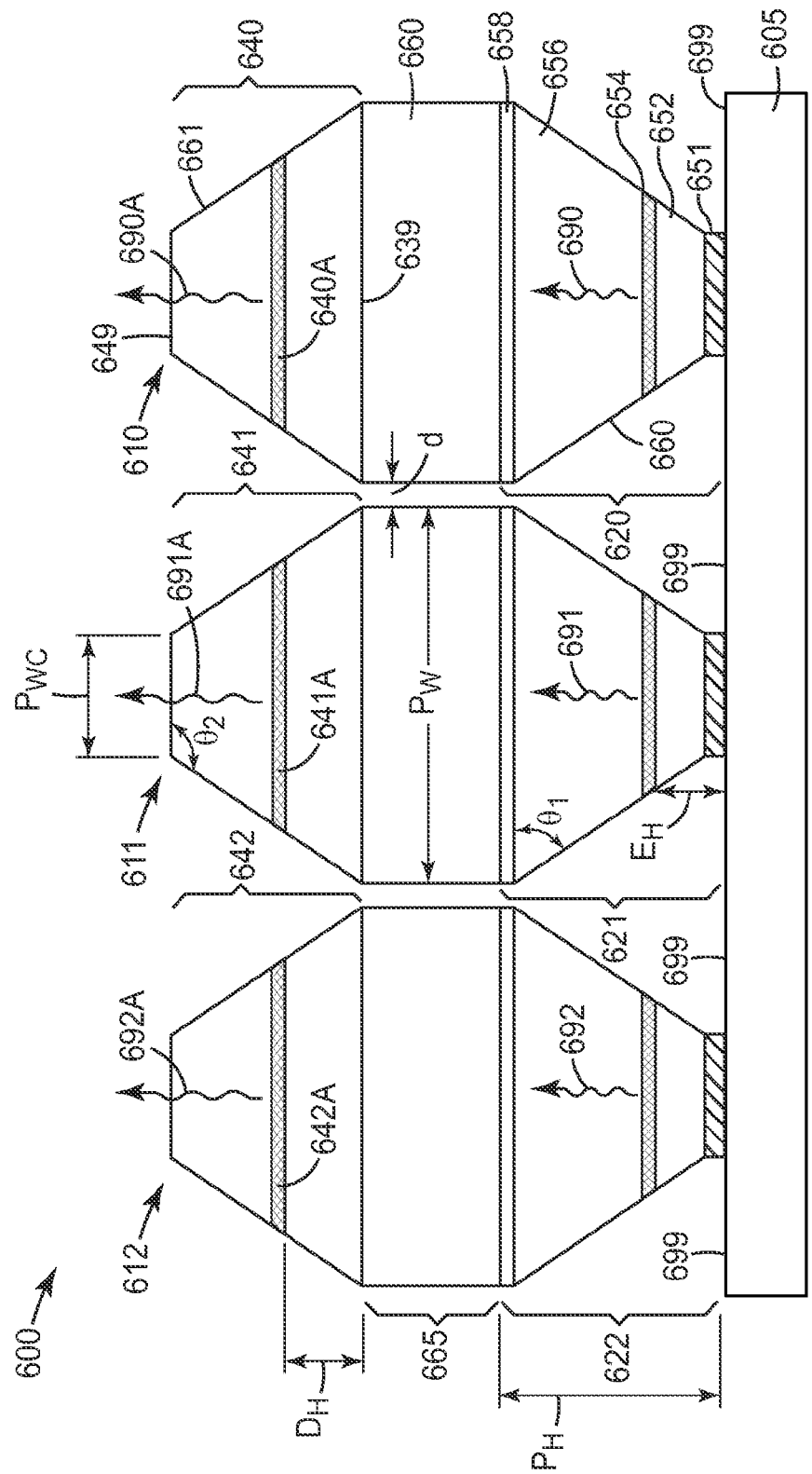
FIG. 6 is a schematic side-view of a pixelated LED.

FIG. 6 is a schematic side-view of a pixelated LED 600 that includes an array of luminescent elements, such as luminescent elements 610-612, disposed on a common substrate 605. Each of the elements 605-699 shown in FIG. 6 correspond to like-numbered elements 305-399 shown in FIG. 3, which have been described previously. For example, the description of substrate 605 in FIG. 6 corresponds to the description of substrate 305 in FIG. 3, and so on. Further, the angle $\theta_1$ shown in FIG. 6 corresponds to the angle $\theta$ shown in FIG. 3. FIG. 6 illustrates one particular embodiment of the pixelated LED 300 of FIG. 3, where each of the light converting elements (LCEs) 640-642 are formed in a truncated trapezoidal shape to further improve the efficiency of light conversion. Each of the truncated trapezoidal shaped LCEs 640-642 can be fabricated in a manner similar to the technique described in FIGS. 8A-8G and FIGS. 9A-9I described elsewhere.

Each of the LCEs 640-642 include a downconverting region 640A-642A positioned at a downconverting region height "$D_H$" from an input surface 639 of each LCE 640-642. Downconverting region height "$D_H$" can theoretically vary from immediately adjacent the input surface 639 to immediately adjacent an output surface 649 of LCE 640-642. Output surface 649 also represents the downconverted pixel width "$P_{WC}$", which is smaller than the pixel width "$P_W$". In one particular embodiment, the downconverting region 640A-642A can be positioned closer to the input surface 639 than to the output surface 649.

Each LCE 640-642 includes LCE sidewalls 661, which collectively form a trapezoidal shape having an angle $\theta_2$ with the output surface 649. In one particular embodiment, the angle $\theta_2$ can range from about 90 degrees to about 165 degrees, from about 85 degrees to about 150 degrees, or from about 80 degrees to about 135 degrees. The LCE sidewalls 661 have similar characteristics as those described for sidewalls 660 of each electroluminescent element, for example, the LCE sidewalls 661 may include undulations resulting from the manufacturing process, or may be curved, or even have stepwise discontinuities, as described elsewhere.

Each LCE 640-642 is bonded in registration to a corresponding electroluminescent element 620-622 using bonding material 660, by any of the techniques described elsewhere. The bonding region 665 can be a continuous layer (not shown) spanning several luminescent elements 610-612. The bonding region 665 can instead be a discontinuous layer as shown in FIG. 6, providing a separation distance "d" between neighboring luminescent elements.

Figure 7:
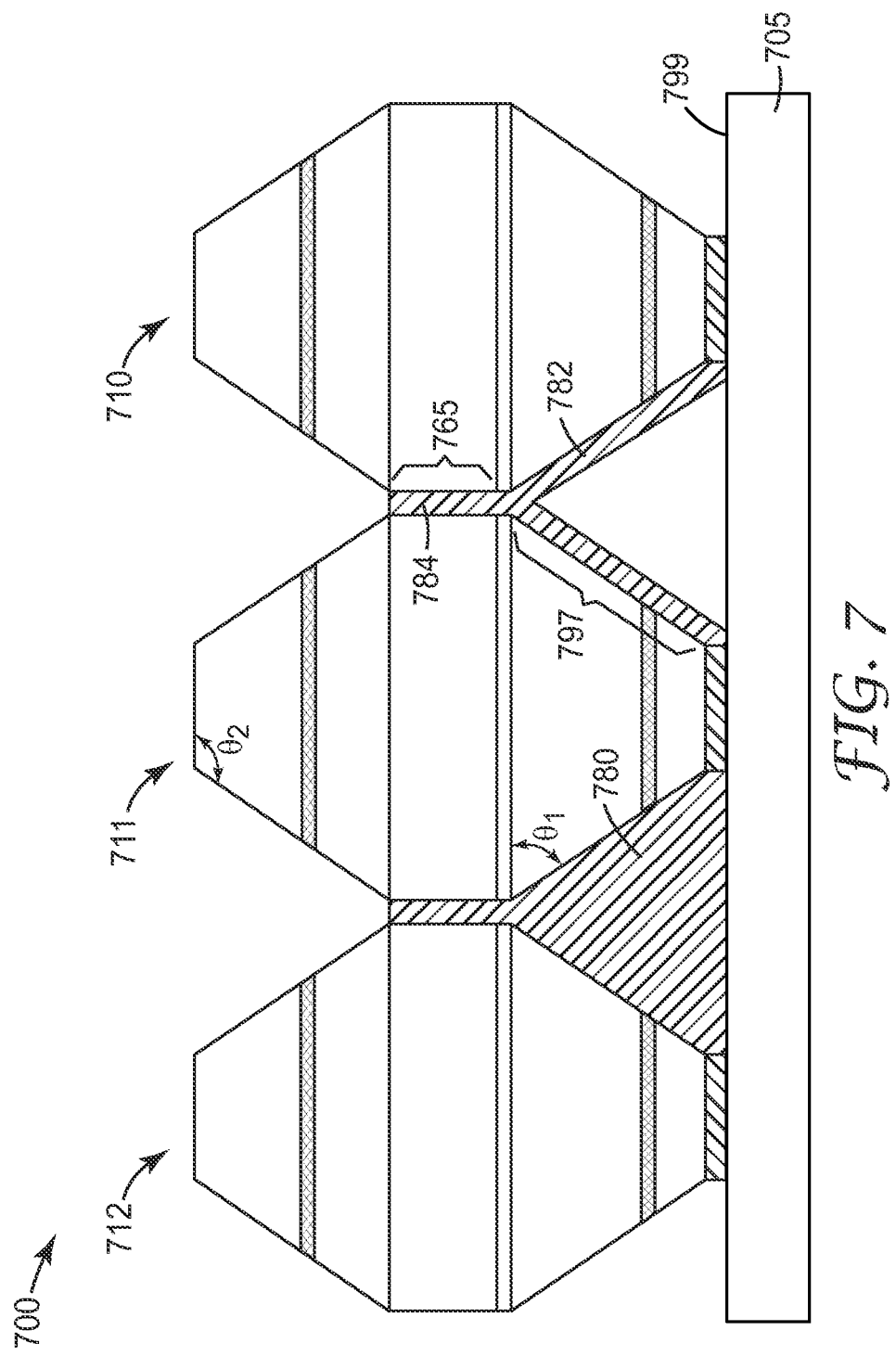
FIG. 7 is a schematic side-view of a pixelated LED.

FIG. 7 is a schematic side-view of a pixelated LED 700 that includes an array of luminescent elements, such as luminescent elements 710-712, disposed on a common substrate 705. Each of the elements 705-799 shown in FIG. 7 correspond to like-numbered elements 605-699 shown in FIG. 6, which have been described previously. For example, the description of substrate 705 in FIG. 7 corresponds to the description of substrate 605 in FIG. 6, and so on. FIG. 7 illustrates one particular embodiment of the pixelated LED 600 of FIG. 6, where portions of the space between adjacent luminescent elements are filled with a material that can further reduce crosstalk and improve efficiency, by isolating the luminescent elements 710-712 from one another.

In one particular embodiment, an isolating material 780 can fill the entire region between neighboring luminescent elements, for example, as shown between luminescent elements 711 and 712 in FIG. 7. In another particular embodiment, an isolating material 784 can fill the region adjacent the bonding portion 765 of the corresponding electroluminescent elements, for example, as shown between luminescent element 710 and 711. In another particular embodiment, an isolating material 782 can also be disposed adjacent the corresponding electroluminescent elements, for example, the sidewall portions 797 of neighboring luminescent elements 710 and 711, as shown in FIG. 7.

The isolating material 780, 782, 784 can be any material or combination of materials that provide optical isolation between neighboring luminescent elements, yet does not provide a conductive path along the sidewall portions 797 of the luminescent elements. In one particular embodiment, the isolating material 780, 782, 784 can be a low refractive index dielectric material, such as a polymer or silica. In another particular embodiment, the isolating material 780, 782, 784 can include more than one layer of material. For example, a first layer immediately adjacent the sidewall portions 797 can be a low index dielectric such as silica, and a second layer can be a reflective material such as aluminum or silver.

FIGS. 8A-8G shows a process schematic for producing a pixelated LED according to one aspect of the disclosure. Each of the elements 805-858 shown in FIGS. 8A-8G correspond to like-numbered elements 305-358 shown in FIG. 3, which have been described previously. For example, the description of substrate 805 in FIG. 8D corresponds to the description of substrate 305 in FIG. 3, and so on.

Figure 8A:
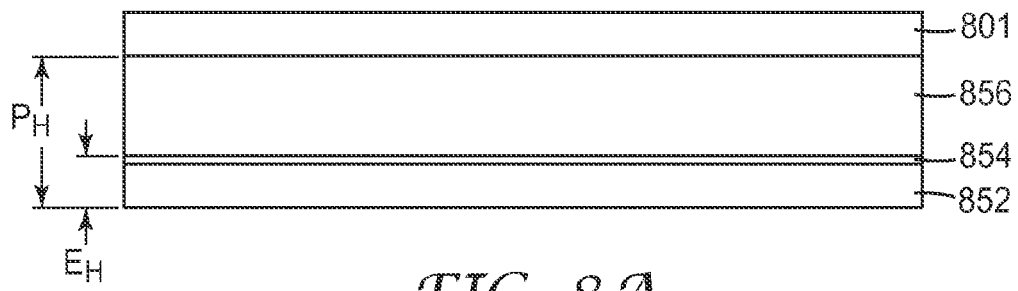
FIGS. 8A-8G show a process schematic for producing a pixelated LED.

In FIG. 8A, a monolithic semiconductor LED including an n-doped semiconductor 856, a p-doped semiconductor 852, and an emissive region 854 are grown on an LED growth substrate 801 using metal organic chemical vapor deposition (MOCVD) or a related technique as known in the art. The grown layers have an associated pixel height "$P_H$" and an emissive region height "$E_H$".

Figure 8B:
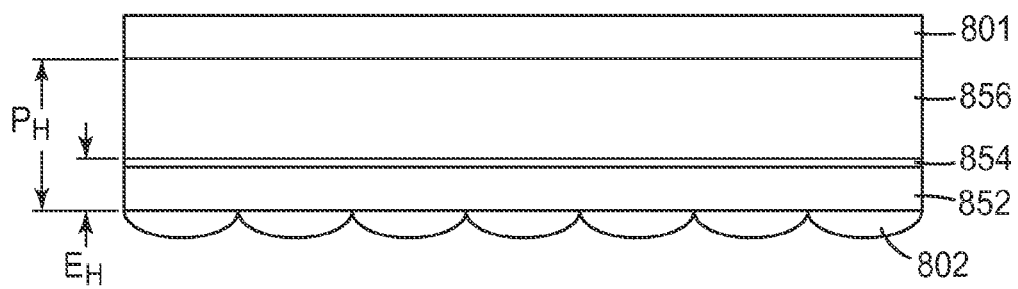
Figure 8C:
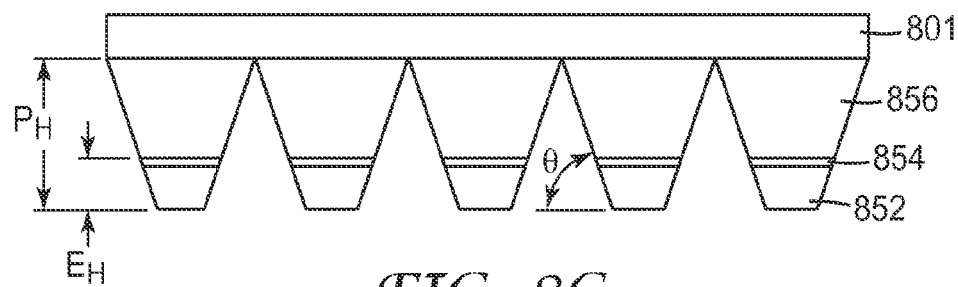

In FIG. 8B, a photoresist 802 is deposited onto the p-doped semiconductor 852 and is patterned using gray scale lithography or conventional photolithography and reflow. The three dimensional pattern can be tailored to result in any final desired electroluminescent element shape, including truncated pyramids having a square or a rectangular cross-section, curved sidewalls, step-change sidewalls, and the like. In FIG. 8C, the semiconductor LED layers 852, 854, 856, can be patterned using a conventional wet or dry etching process. The angle θ of the inverted truncated pyramid shape and the depth of etching can vary (as shown, for example, in FIG. 3 and FIG. 4), depending on the photoresist pattern and etching conditions used.

Figure 8D:
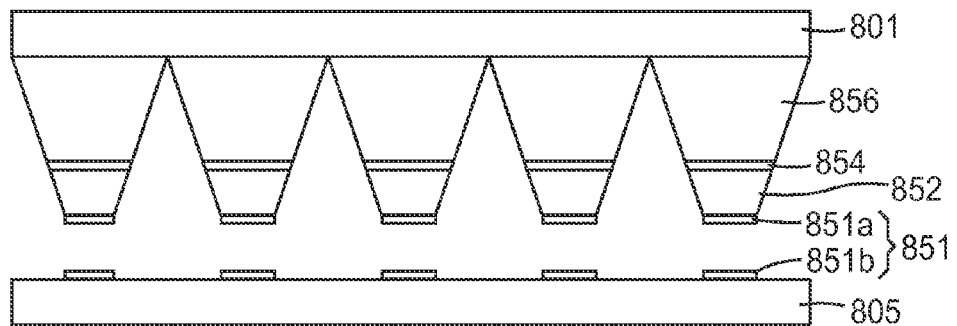
Figure 8E:
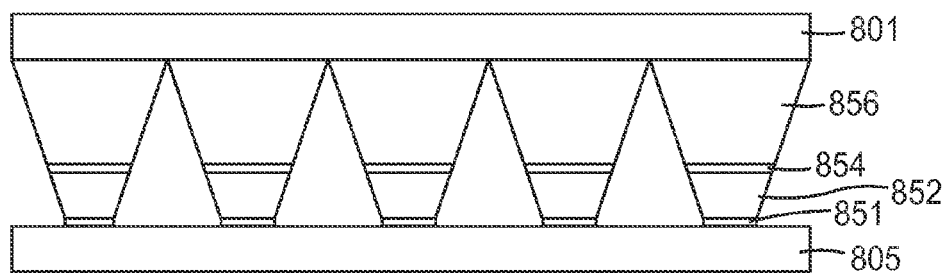

In FIG. 8D, an ohmic contact reflector 851a is photolithographically patterned and deposited on the p-doped semiconductor layer 852, and a corresponding metal contact 851b is deposited on the LED array substrate 805. Metal contact 851b may further contact a drive circuit for each individual pixel as described elsewhere. Collectively, ohmic contact reflector 851a and metal contact 851b, becomes first electrode 851 when bonded together using a known wafer bonding process, as shown in FIG. 8E.

Figure 8F:
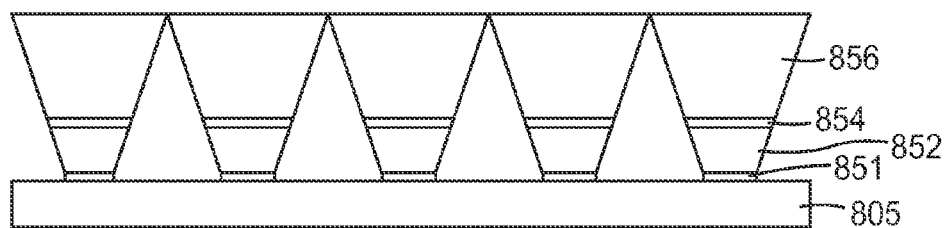
Figure 8G:
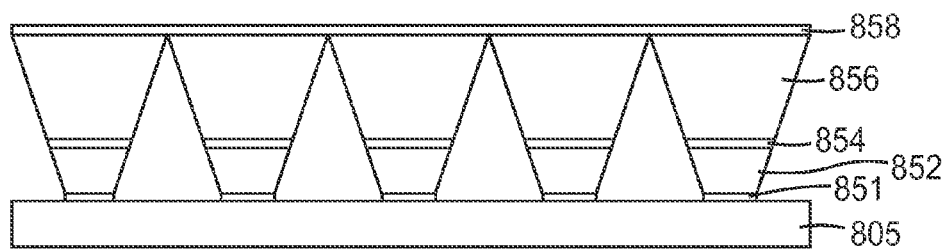

In FIG. 8F, the LED growth substrate 801 is removed using, for example, a known laser liftoff technique, and a second electrode 858 is deposited on the top of the LED array as shown in FIG. 8G. In one particular embodiment, the second electrode 858 is a transparent electrode including, for example, indium tin oxide and a grid of thin metal wires.

FIGS. 9A-9I shows a process schematic for producing a pixelated LED according to one aspect of the disclosure. In FIGS. 9A-9I, a technique is depicted for providing optical isolation between adjacent luminescent elements, such as the isolation shown and described with reference to FIG. 5 and FIG. 7. Each of the elements 905-958 shown in FIGS. 9A-9I correspond to like-numbered elements 305-358 shown in FIG. 3, which have been described previously. For example, the description of substrate 905 in FIG. 9F corresponds to the description of substrate 305 in FIG. 3, and so on.

Figure 9A:
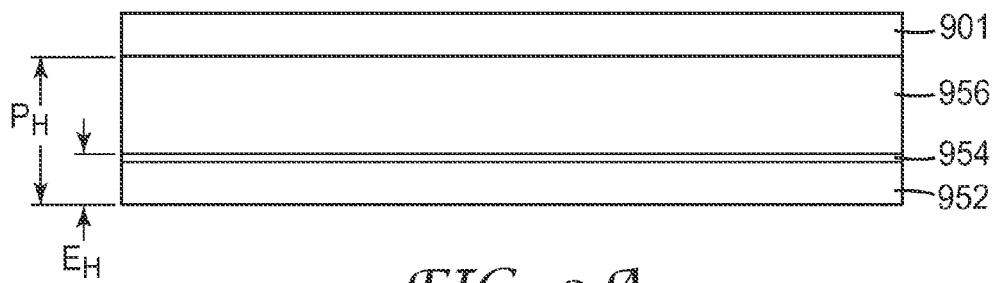
FIGS. 9A-9I show a process schematic for producing a pixelated LED.

In FIG. 9A, a monolithic semiconductor LED including an n-doped semiconductor 956, a p-doped semiconductor 952, and an emissive region 954 are grown on an LED growth substrate 901 using metal organic chemical vapor deposition (MOCVD) or a related technique as known in the art. The grown layers have an associated pixel height "$P_H$" and an emissive region height "$E_H$".

Figure 9B:
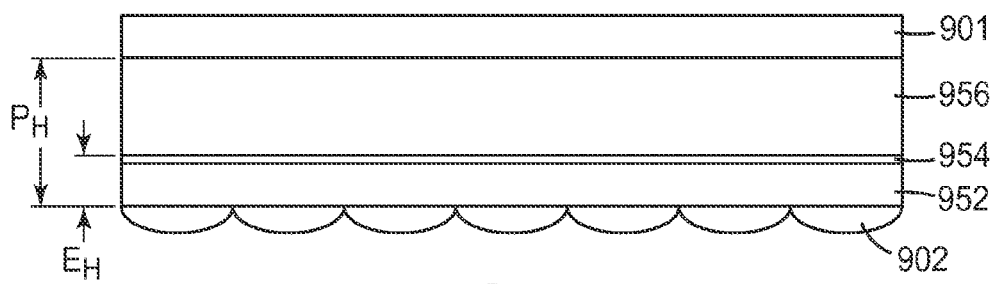
Figure 9C:
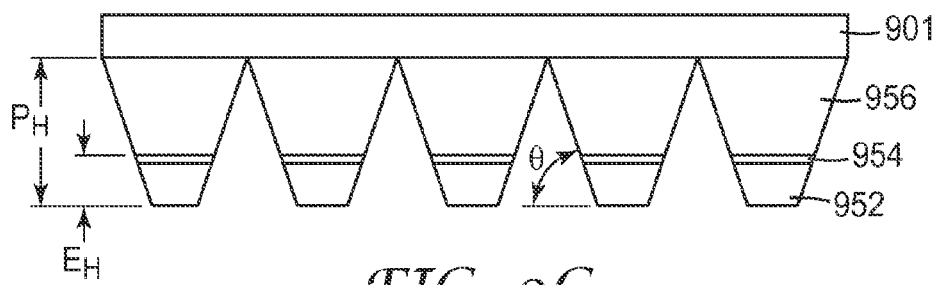
Figure 9D:
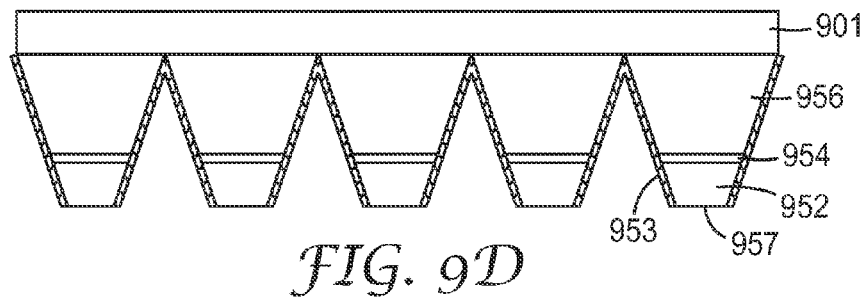
Figure 9E:
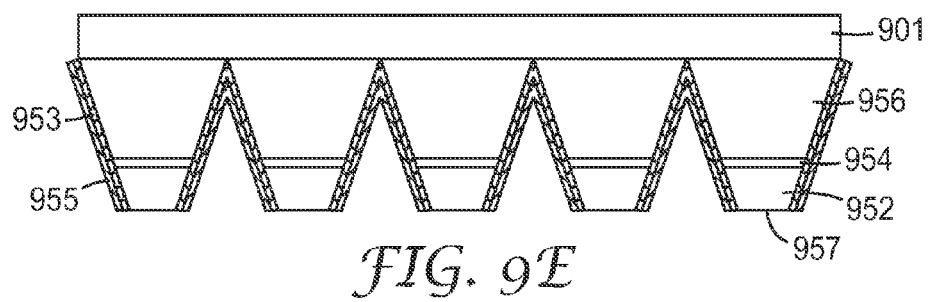

In FIG. 9B, a photoresist 902 is deposited onto the p-doped semiconductor 952 and is patterned using gray scale lithography or conventional photolithography and reflow. The three dimensional pattern can be tailored to result in any final desired electroluminescent element shape, including truncated pyramids having a square or a rectangular cross-section, curved sidewalls, step-change sidewalls, and the like. In FIG. 9C, the semiconductor LED layers 952, 954, 956, can be patterned using a conventional wet or dry etching process. The angle θ of the inverted truncated pyramid shape and the depth of etching can vary (as shown, for example, in FIG. 3 and FIG. 4), depending on the photoresist pattern and etching conditions used, In FIG. 9D, a low index dielectric 953 is deposited on the inverted truncated pyramid shape resulting from the process in FIG. 9C. The low index dielectric 953 can include, for example, an oxide of silicon; however, any low index dielectric can be used. A subsequent coating of a reflective metal 955 is deposited on the low index dielectric 953, to provide further optical isolation of neighboring pixels, as shown in FIG. 9E. The process steps described in FIGS. 9D-9E can be repeated as many times as desired, to accomplish the desired optical isolation.

Figure 9F:
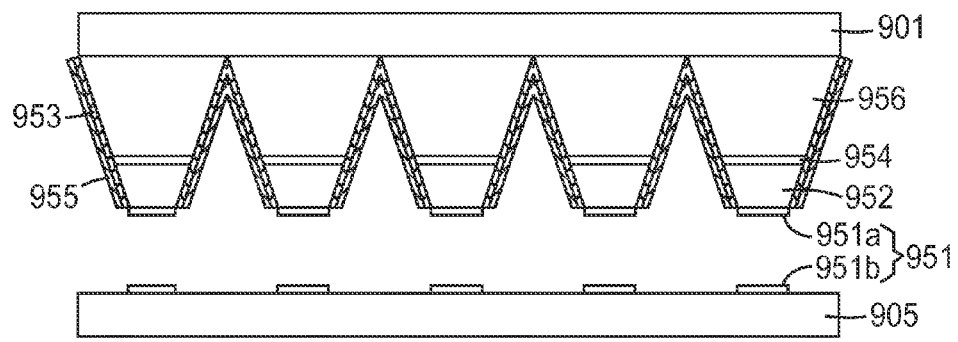

Before proceeding with the subsequent step described in FIG. 9F, the low index dielectric 953 and reflective metal 955 is removed from a planar surface 957 of the p-doped semiconductor 952, by a known technique such as chemical mechanical polishing (CMP). An alternative to removing the low index dielectric 953 and reflective metal 955 is to prevent deposition of these materials on the planar surface 957, for example, by coating the planar surface 957 with a photoresist (not shown) prior to the deposition.

Figure 9G:
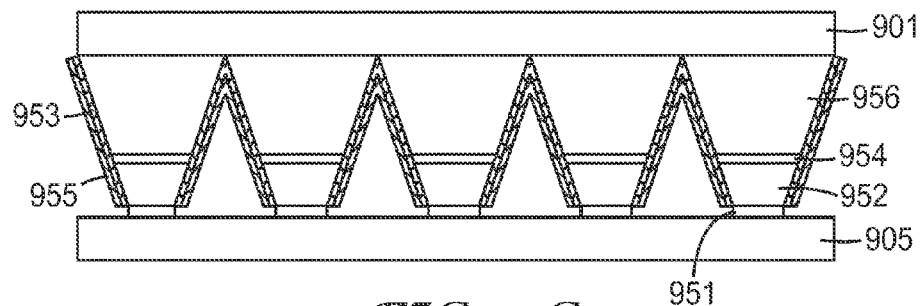

In FIG. 9F, an ohmic contact reflector 951a is photolithographically patterned and deposited on the p-doped semiconductor layer 952, and a corresponding metal contact 951b is deposited on the LED array substrate 905. Metal contact 951b may further contact a drive circuit for each individual pixel as described elsewhere. Collectively, ohmic contact reflector 951a and metal contact 951b, becomes first electrode 951 when bonded together using a known wafer bonding process, as shown in FIG. 9G.

Figure 9H:
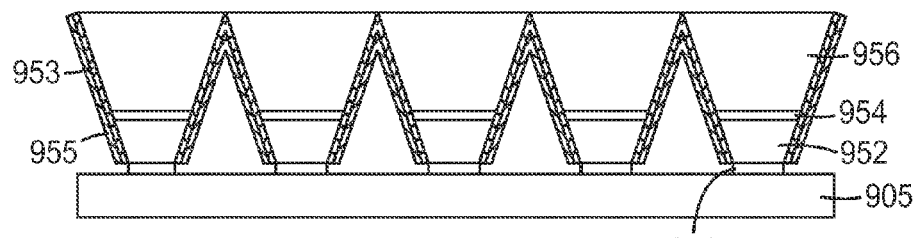
Figure 9I:
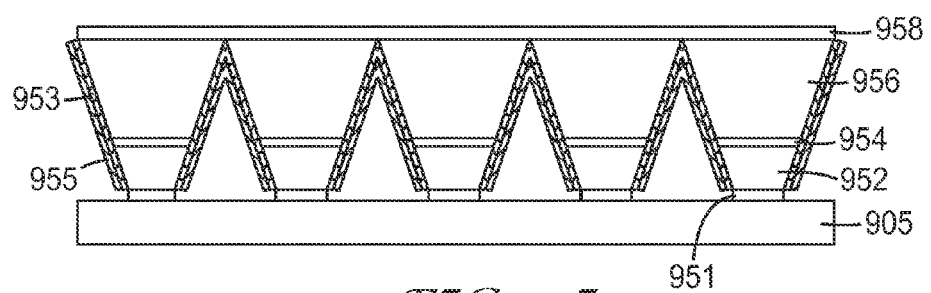

In FIG. 9H, the LED growth substrate 901 is removed using, for example, a known laser liftoff technique, and a second electrode 958 is deposited on the top of the LED array as shown in FIG. 9I. In one particular embodiment, the second electrode 958 is a transparent electrode including, for example, indium tin oxide and a grid of thin metal wires.

FIGS. 16A-16G shows a process schematic for producing a pixelated LED according to one aspect of the disclosure. Each of the elements 1605-1658 shown in FIGS. 16A-16G correspond to like-numbered elements 305-358 shown in FIG. 3, which have been described previously. For example, the description of substrate 1605 in FIG. 16A corresponds to the description of substrate 305 in FIG. 3, and so on.

Figure 16A:
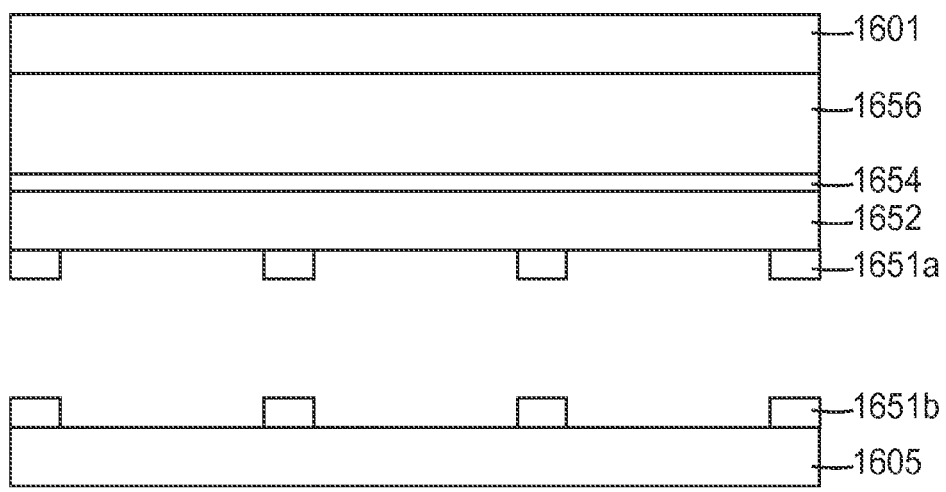
FIG. 16A-16G show a process schematic for producing a pixelated LED.
Figure 16B:
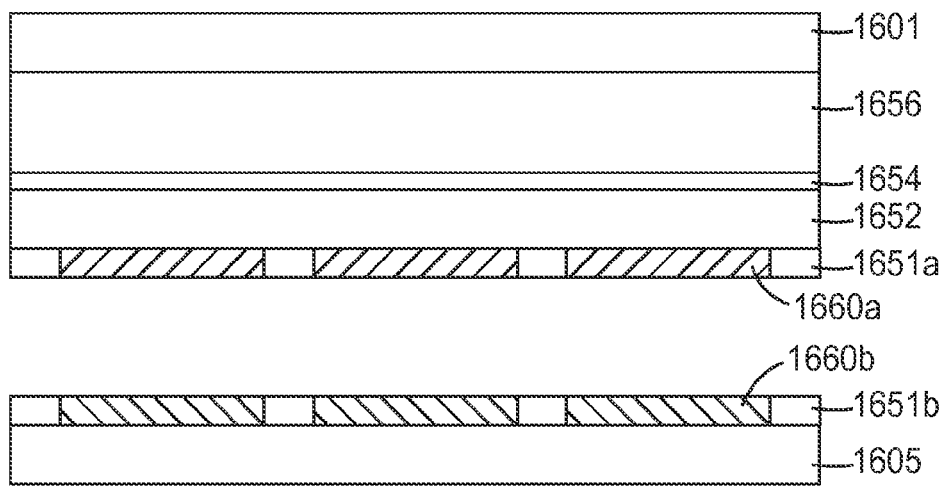
Figure 16C:
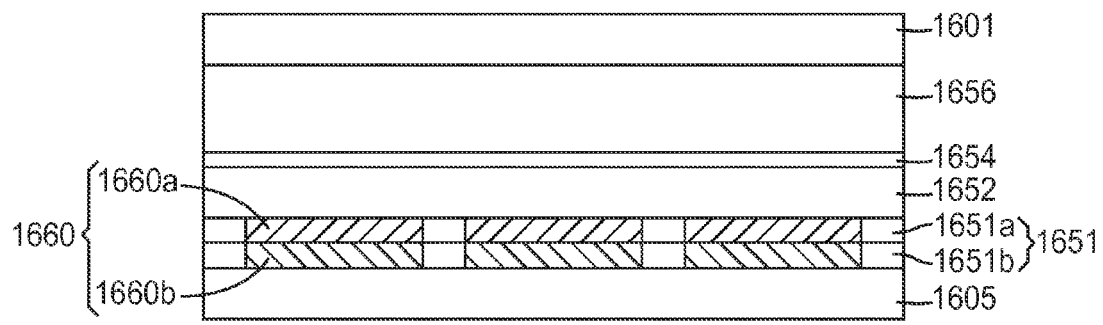

In FIG. 16A, a monolithic semiconductor LED including an n-doped semiconductor 1656, a p-doped semiconductor 1652, and an emissive region 1654 are grown on an LED growth substrate 1601 using metal organic chemical vapor deposition (MOCVD) or a related technique as known in the art. An ohmic contact reflector 1651a is photolithographically patterned and deposited on the p-doped semiconductor layer 1652, and a corresponding metal contact 1651b is deposited on an LED array substrate 1605. Metal contact 1651b may further contact a drive circuit for each individual pixel, as described elsewhere. An electrically insulating material 1660a and 1660b, is deposited between each of the ohmic contact reflectors 1651a and metal contacts 1651b, respectively, and planarized to provide a flat bonding surface. Collectively, ohmic contact reflector 1651a and metal contact 1651b, becomes first electrode 1651 when bonded together using a known wafer bonding process, as shown in FIG. 16C.

Figure 16D:
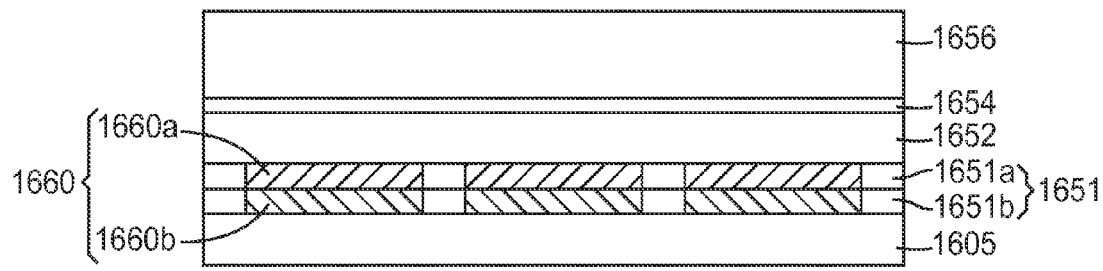
Figure 16E:
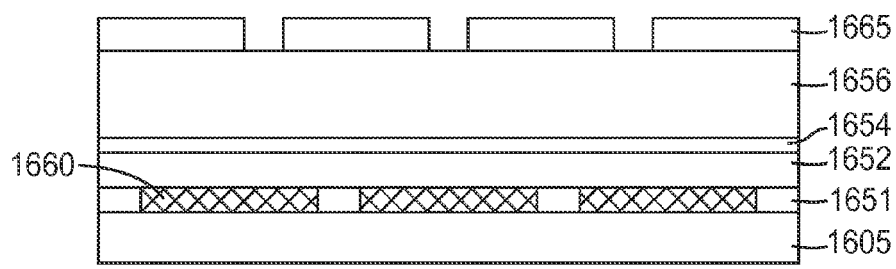

In FIG. 16D, the LED growth substrate 1601 is removed using, for example, a known laser liftoff technique, and a hard mask 1665, for example a silica hard mask, is photolithographically patterned on n-doped semiconductor 1656, using known techniques, as shown in FIG. 16E.

Figure 16F:
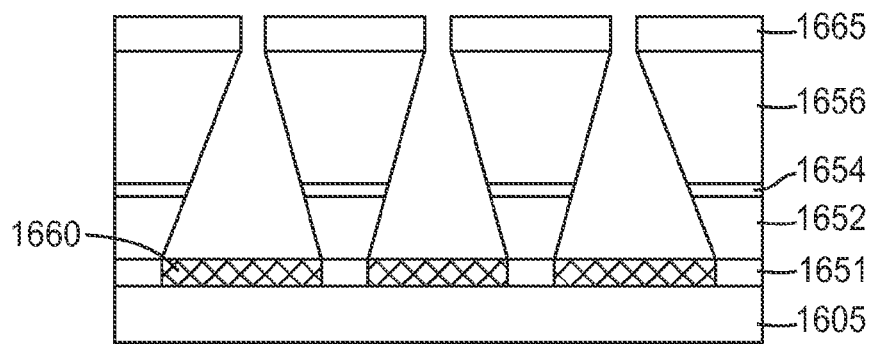

In FIG. 16F, the array of pixels in the semiconductor layers can then be patterned using, for example, a hot phosphoric acid ($H_3PO_4$) etch. This acid has been shown to preferentially etch the {1012} plane in GaN, as described, for example, in C.-F. Lin et al. *Electrochemical and Solid State Letters*, 12 (7), H233-H327 (2009). Alternatively, the gaps between the pixels may be dry etched or laser scribed to form narrow trenches, and the array exposed to $H_3PO_4$ to preferentially etch the desired inverted truncated pyramid shape.

Figure 16G:
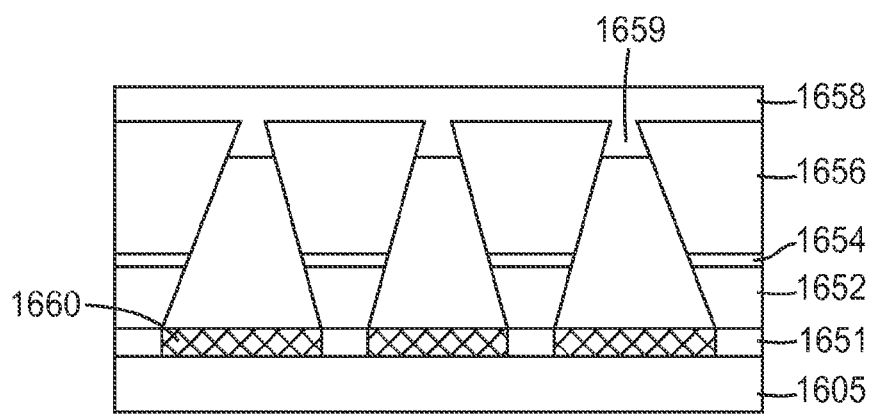

In FIG. 16G, the hard mask 1665 is removed using any known technique, and a second electrode 1658 is deposited on the top of the LED array. During deposition of the second electrode 1658, a portion of the deposited material 1659 may extend slightly into the etched cavity, as shown in the FIG. 16G. In one particular embodiment, the second electrode 1658 is a transparent electrode including, for example, indium tin oxide and a grid of thin metal wires.

EXAMPLES

The performance of a pixelated LED array having inverse truncated pyramid shapes was modeled and optimized using LightTools optical simulation software, available from Optical Research Associates, Pasadena, Calif. Each LED pixel was modeled as a solid slab with a bulk absorption coefficient of 100 $cm^{-1}$ and an index of refraction of 2.5. The distance between the emitting region and the bottom reflector ($E_H$) was set to be 200 nm, typical of GaN LEDs. The angular distribution of launched rays from the LED active region was modeled as emission from a plane of random dipoles, which corresponds to an isotropic angular distribution. Any effect of photon recycling was ignored in the simulation.

Two different optical power components were considered during analysis of the LED pixel array: $\eta_{forward}$ or "forward optical efficiency", represents the fraction of the optical energy that escaped from the top surface of the desired LED pixel into a forward hemisphere; $\eta_{side}$ represents the fraction of optical energy emitted from side surfaces of the pixel that interacts with the neighboring pixels. In general, the sum of $\eta_{size}+\eta_{forward}$ does not equal 1, due to the absorptive losses inside the LED pixel. We defined the fraction of optical crosstalk as, $$\text{Crosstalk}=\eta_{side}/(\eta_{forward}+\eta_{side}) \quad (1)$$

Figure 11:
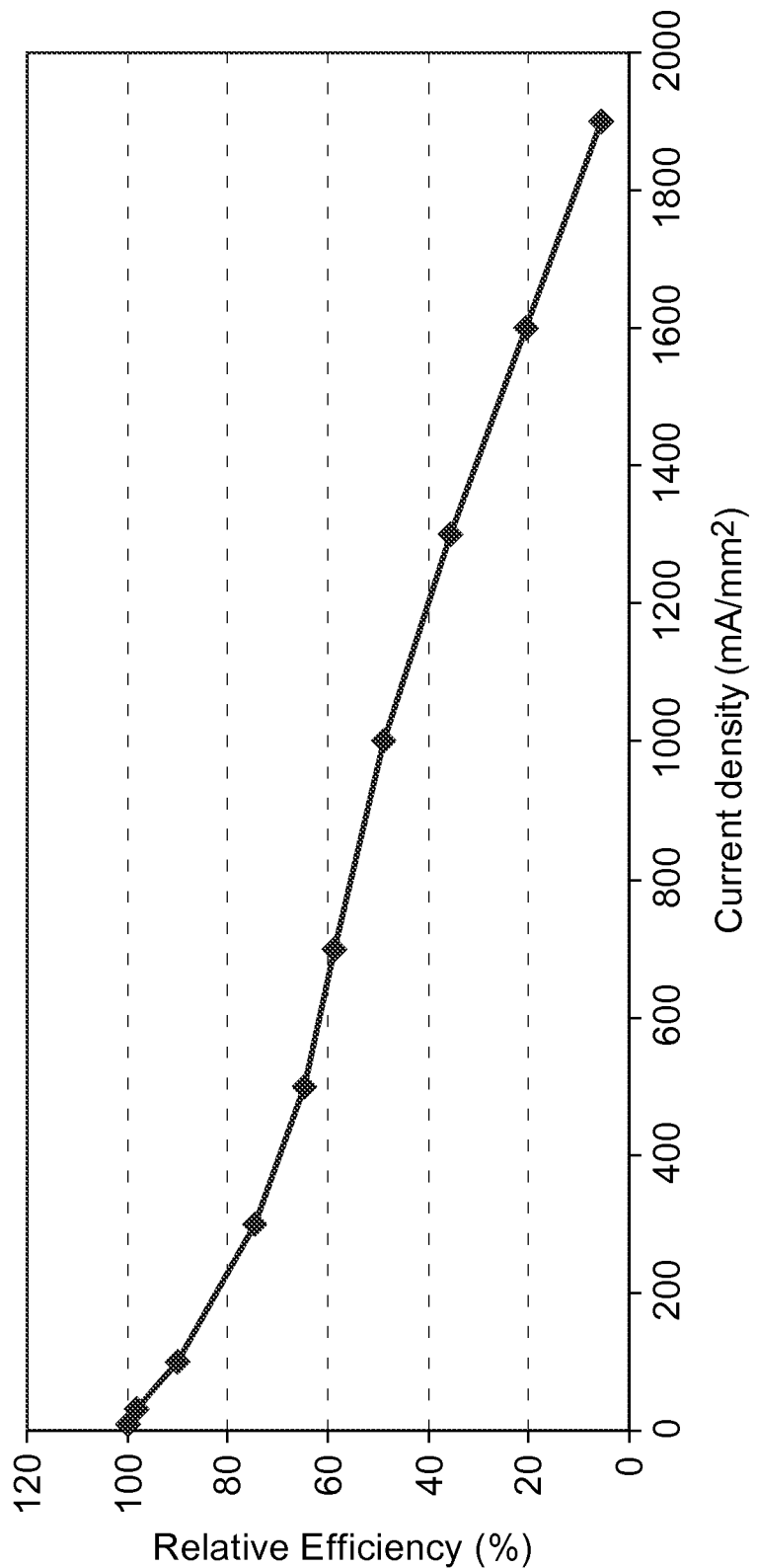
FIG. 11 shows device efficiency vs. drive current density.

Modification of the sidewalls of the LED pixel into the oblique angles of the inverted truncated pyramid, results in a reduced emitting area and consequently a potential for a reduced output. As a result, a higher injection current density may be required to attain the specified output power. However, the efficiency of GaN LEDs is well known to decrease with increased current density (known as the "current droop" effect). FIG. 11 shows a typical LED efficiency as a function of the drive current density. The competing optical effects of light extraction and current droop must be considered to determine the optimum side wall angle to maximize external power efficiency for a given pixel size.

A typical mini projector with a pixelated emissive imager has a specified system lumen output of 15 l m or 50 mW. This projector has a lens efficiency of 25%, thus the required power output of the imager panel is 200 mW. With a VGA resolution (640×480 pixels), 5 um pixel size and 2.5 um subpixel size (2×2 subpixels per pixel), the total panel size is 3.2 mm×2.4 mm. These specifications correspond to a required optical power density of 26 $mW/mm^2$ for each pixel. For each variation in sidewall angle, a different current density (J) is required to reach this output level. The data in FIG. 11 was fit to a polynomial expression $\eta(J)=1-0.0033(J-10)^{0.75}$ The required current density for each angle was determined by solving equation (2) for J, $$\eta_{forward}(\theta)\times\eta_0\times\eta(J)\times J\times A(\theta)\times V=26\times A_{pixel} \quad (2)$$

where $\eta_0$ at is the small current density internal quantum efficiency for the LED, $A_{pixel}$ is the area of the top emitting surface of the pixel (in the case of 2.5 $um^2$) and V is the forward voltage. An $\eta_0$ of 50% and forward voltage of 3.3 Volts was assumed in all cases. Current density dependence of the forward voltage was neglected. The external pixel power efficiency (EPE) for a given sidewall angle is then calculated as $EPE=\eta_{forward}(\eta)\times\eta_0\times\eta(J)$. We then defined a figure of merit (FOM), which is dependent on the sidewall angle, as:

$$FOM=EPE/\text{Crosstalk} \quad (3)$$

Example 1

Modeling of LED Pixels Having Inverted Truncated Pyramid Shape

Figure 10A:
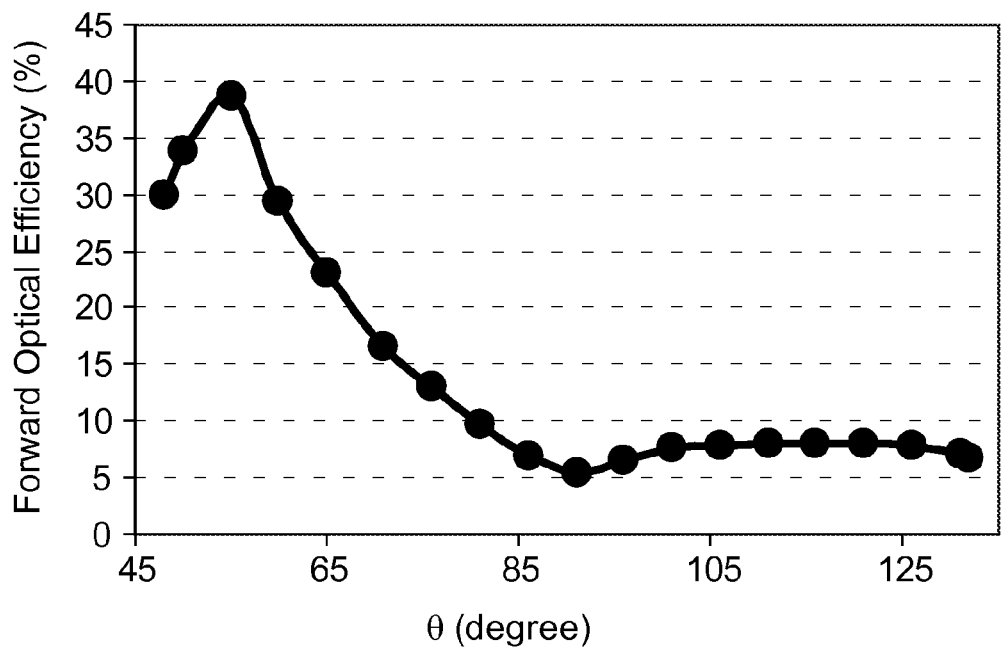
FIGS. 10A-10B shows efficiency and crosstalk vs. sidewall angle.
Figure 10B:
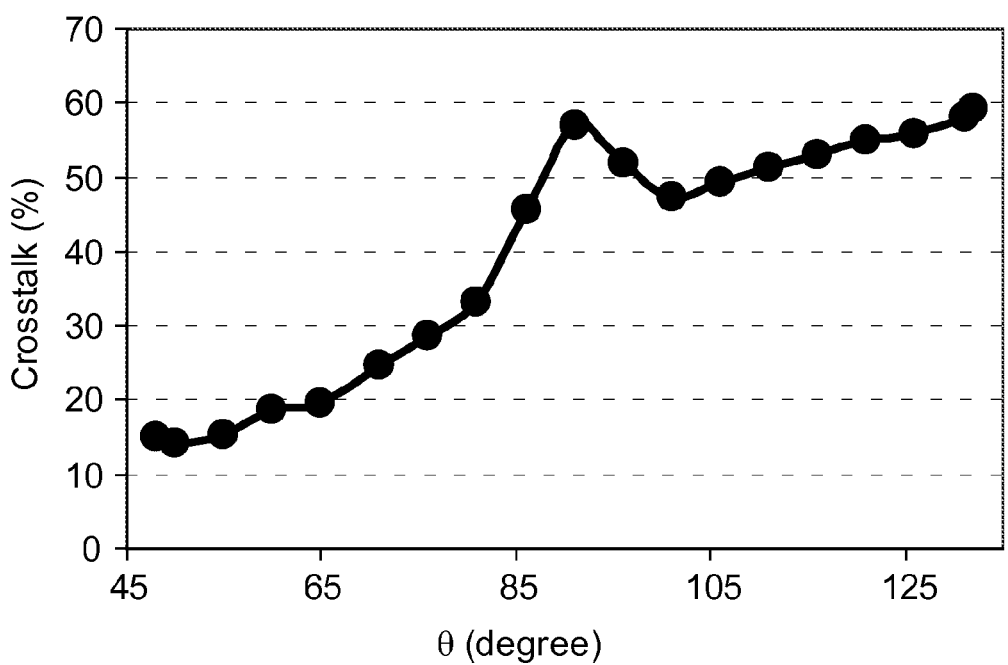

A pixelated LED array similar to FIG. 3 was modeled. The pixel width, $P_W$, was set to 2.5 um and the pixel height, $P_H$, was set to 1.25 um. The optical properties of the LED pixel substrate were set to be 100% absorptive and the first electrode was set to a reflectivity of 50%. FIGS. 10A-10B show the simulated effect of sidewall angle θ on $\eta_{forward}$ and crosstalk. At the optimum sidewall angle, the inverted truncated pyramid pixel structure $\eta_{forward}$ increased by a factor of almost 7× relative to the case of a pixel with 90 degree sidewalls, and also reduced the cross talk to as low as 20%.

Figure 12:
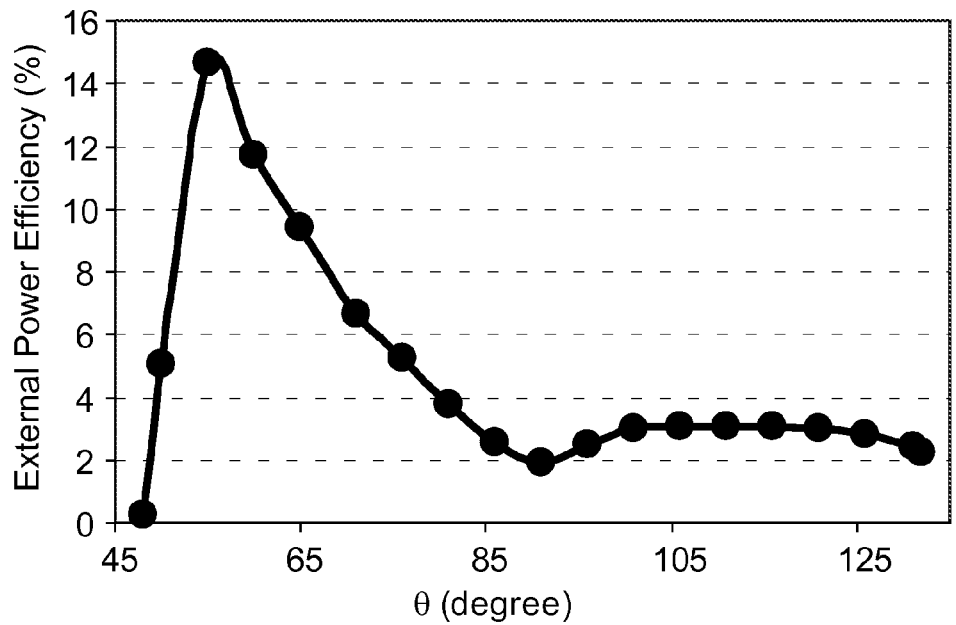
FIG. 12 shows power efficiency vs. sidewall angle.
Figure 13:
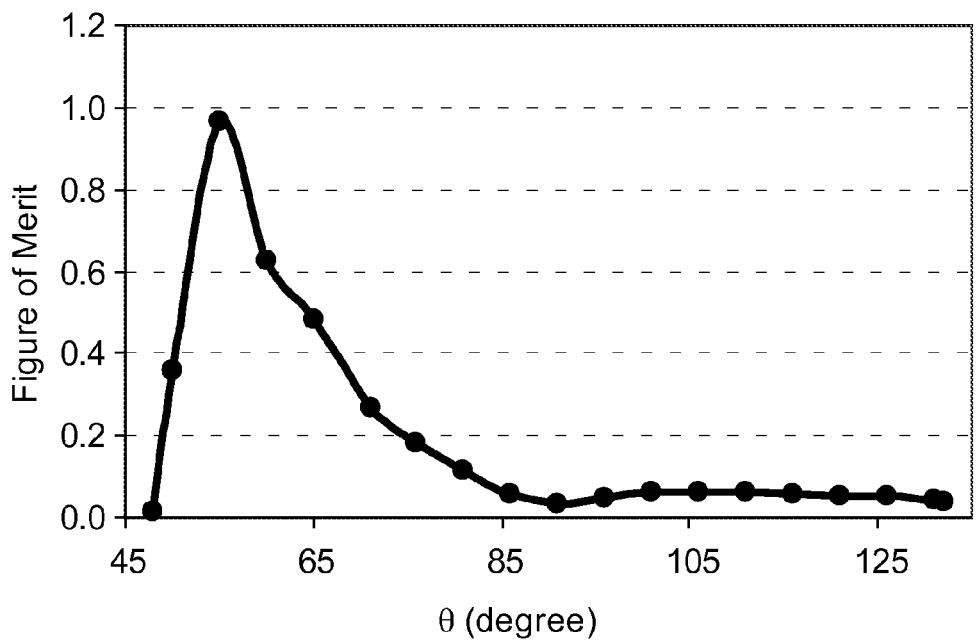
FIG. 13 shows the calculated FOM vs. sidewall angle.

FIG. 12 shows the simulation results for external power efficiency of each pixel taking into account the effect of current droop. FIG. 13 shows the calculated FOM as a function of sidewall angle θ. There is a distinct peak at approximately θ=55° where the system efficiency is maximized while also minimizing optical crosstalk.

Example 2

Figure 14A:
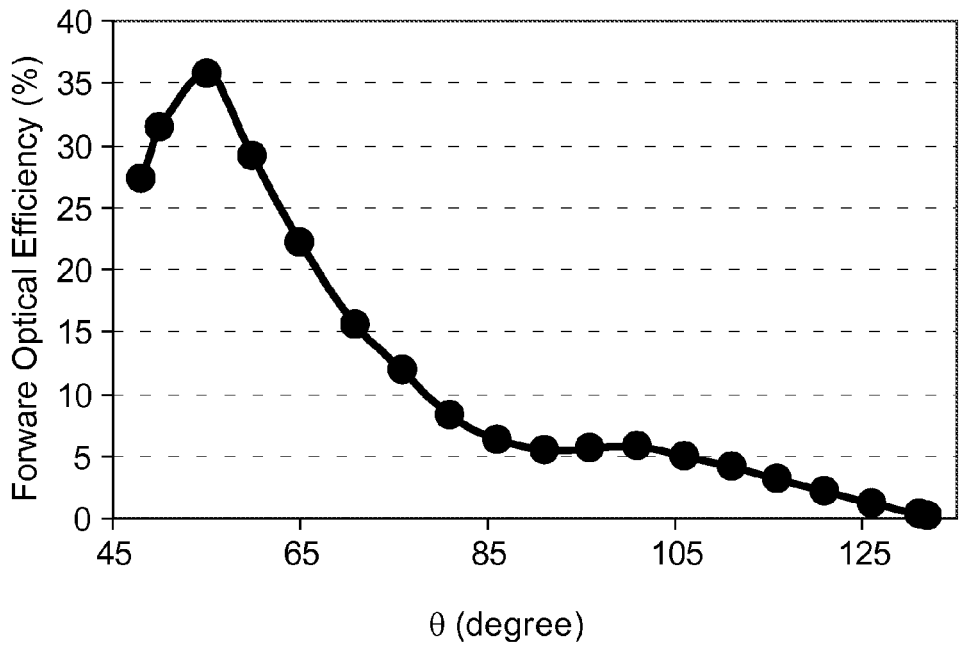
FIGS. 14A-14B shows efficiency and crosstalk vs. sidewall angle.
Figure 14B:
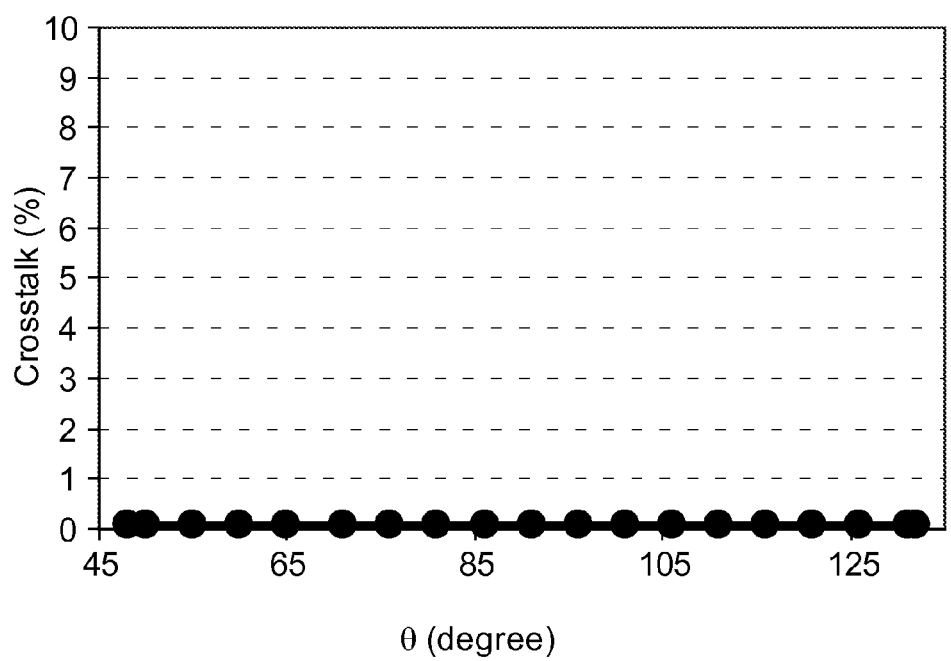

Modeling of Pixelated LED Having Inverted Truncated Pyramid Shape with Optical Isolation A reflective isolation material was placed between neighboring pixels as described in FIG. 5 and FIG. 7. The same pixel structure as in Example 1 was used in this simulation, except that the sidewalls were coated with 90% reflective silver mirror. FIGS. 14A-14B show forward optical efficiency and crosstalk as a function of sidewall angle θ. Because the silver mirror largely blocked the interaction between neighboring pixels, the optical crosstalk became very minimal, as shown in FIG. 14B.

Example 3

Modeling of Larger LED Pixels Having Inverted Truncated Pyramid Shape

Figure 15A:
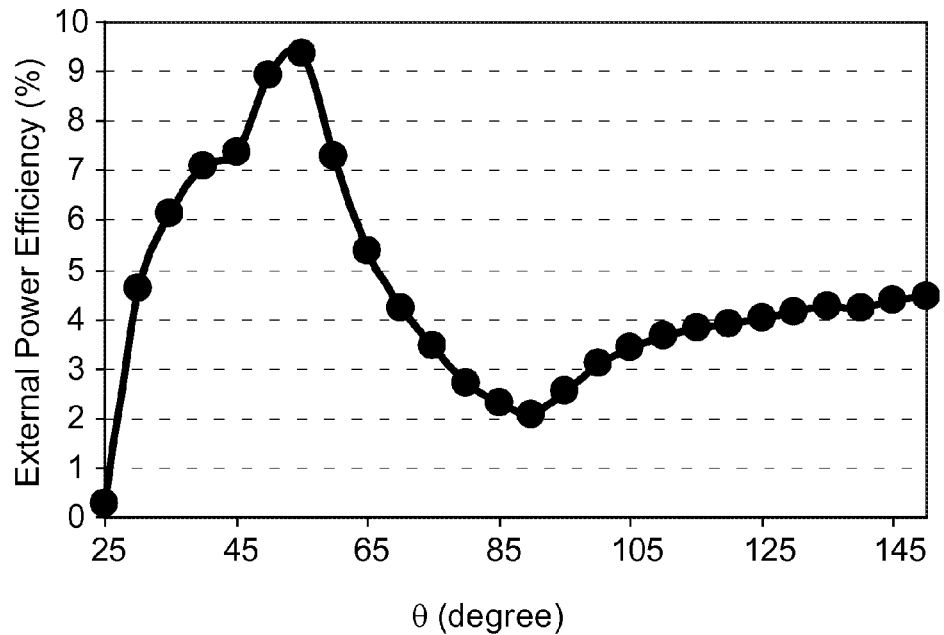
FIG. 15A-15C shows efficiency, crosstalk, and FOM vs. sidewall angle.
Figure 15B:
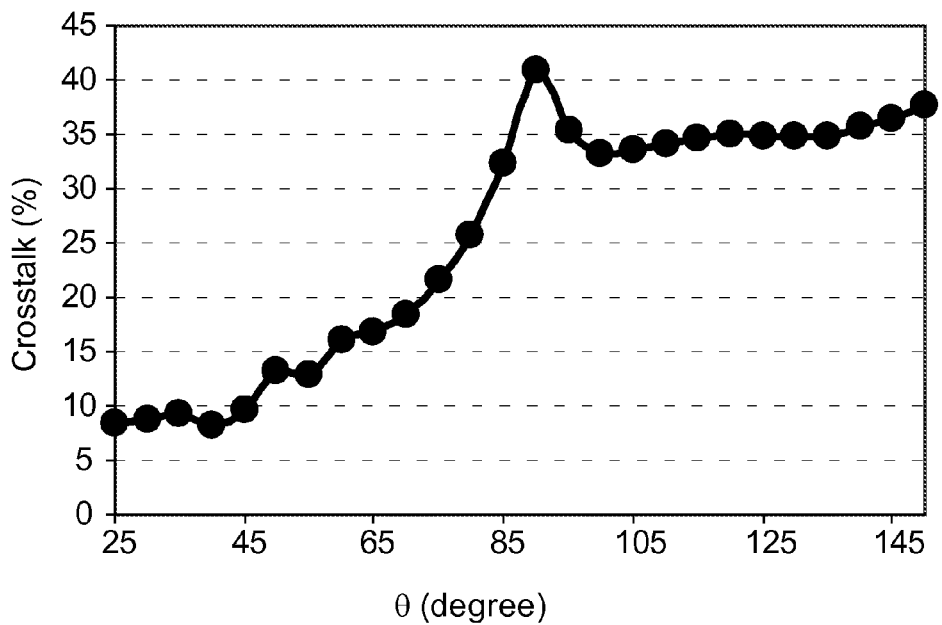
Figure 15C:
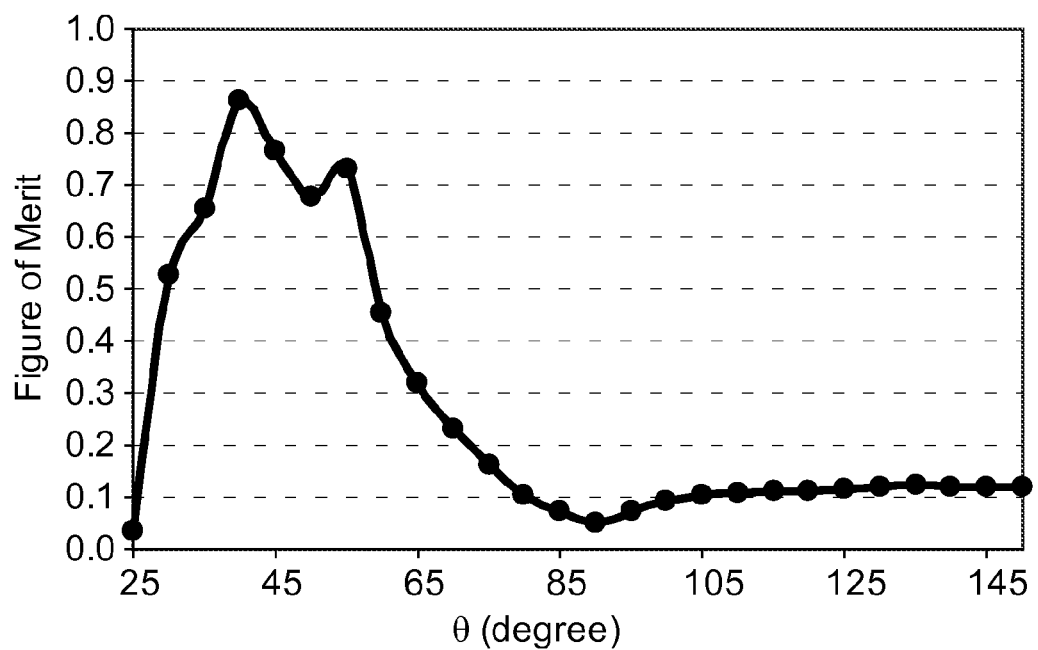

Larger LED pixels or LED pixels with smaller aspect ratio ($P_H/P_W$) can have a wider range of possible sidewall angles. In this example, the pixel width set to $P_W$=5 um and the pixel height to $P_H$, was set to 1.25 um. FIG. 15A and FIG. 15B show the EPE and crosstalk, respectively, as a function of sidewall angle for $P_W$=5 um. The same required optical power density of 26 $mW/mm^2$ was used as in Example 2. The optical efficiency peaks at a shallower sidewall angle compared to the case of 2.5 um pixel. FIG. 15C shows the optimization of pixel shaping using the figure of merit described previously. The figure of merit maximizes at about 35° to about 55° sidewall angles.

Example 4

Modeling of LED Pixels Having Inverted Truncated Pyramid Shape in Registration with Truncated Pyramid Shaped LCEs A pixelated color converter was modeled using the pixelated LED array described in Example 1, with an array of truncated trapezoidal pyramid LCEs bonded to the emission surface as shown in FIG. 6. In addition to the efficiency and crosstalk advantage discussed before, the shaped electroluminescent luminescent device provides an optimal photon-injection cross section for the LCE. The shaped pixel technology was also used to improve light extraction efficiency of the LCE. The sidewall angle ($\theta_2$) of the LCE was set to be greater than 90° to maximize the pump-photon absorption cross section. Optical isolation was simulated by a layer of silver disposed between pixels to reduce crosstalk, as shown in FIG. 7.

All of the dimensions and material properties were the same as provided in Example 2, with the addition of the following (referring to FIG. 6): bonding region 665 was 1 μm thick, downconverter height ($D_H$) was 1 μm, LCE height (that is, the distance from input surface 639 to output surface 649) was 2 μm, The LCE was set to have an internal quantum efficiency of 90%, emission wavelength of 530 nm (resulting in a Stokes shift energy loss of approximately 450/530) and optical absorption of 100 cm$^{-1}$.

A control simulation was modeled for a straight-sidewall LED as shown in FIG. 2 (that is, each of the sidewall angles ($\theta_1$) and ($\theta_2$) were set to 90 degrees, resulting in a pixel power efficiency of less than 0.5%. A shaped LCE in registration with the shaped pump-pixel was modeled, where sidewall angles ($\theta_1$) and ($\theta_2$) were set to 60 degrees and 115 degrees, respectively, resulting in a external power efficiency of about 3.0% (that is, about 6 times better efficiency than the control).

Unless otherwise indicated, all numbers expressing feature sizes, amounts, and physical properties used in the specification and claims are to be understood as being modified by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

All references and publications cited herein are expressly incorporated herein by reference in their entirety into this disclosure, except to the extent they may directly contradict this disclosure. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A pixelated light emitting diode (LED), comprising:
two or more monolithically integrated electroluminescent elements disposed adjacent each other on a substrate, each electroluminescent element comprising:
a p-doped semiconductor disposed adjacent the substrate;
an n-doped semiconductor disposed adjacent the p-doped semiconductor, opposite the substrate;
an emissive region between the n-doped semiconductor and the p-doped semiconductor;
a first electrode between the substrate and the p-doped semiconductor, and an opposing light emitting surface adjacent the n-doped semiconductor, wherein the light emitting surface comprises a second electrode; and
a color converter disposed adjacent the light emitting surface of each electroluminescent element,
wherein at least a portion of each electroluminescent element immediately adjacent the substrate comprises an inverted truncated pyramidal shape.

2. The pixelated LED of claim 1, wherein an angle between the substrate and a side of the inverted truncated pyramidal shape ranges from about 35 degrees to about 70 degrees.

3. The pixelated LED of claim 1, wherein each color converter comprises a potential well.

4. The pixelated LED of claim 3, wherein the potential well comprises a group II-VI or a group III-V semiconductor.

5. The pixelated LED of claim 1, wherein the emissive region is positioned closer to the first electrode than to the light emitting surface.

6. The pixelated LED of claim 5, wherein a distance between the emissive region and the first electrode ranges from about 150 nm to about 250 nm.

7. A pixelated light emitting diode (LED), comprising:
two or more monolithically integrated electroluminescent elements disposed adjacent each other on a substrate, each electroluminescent element comprising a p-n junction having a first major light emitting surface and a smaller opposing second major surface adjacent the substrate; and a color converter disposed adjacent the first major light emitting surface of each electroluminescent element.

8. The pixelated LED of claim 7, wherein each electroluminescent element includes a cross-sectional area parallel to the substrate, increasing along a direction perpendicular to the substrate for a portion of a distance from the second major surface to the first major light emitting surface.

9. The pixelated LED of claim 7, wherein each p-n junction comprises a quantum well positioned closer to the second major surface than to the first major light emitting surface.

10. The pixelated LED of claim 9, wherein a distance between the quantum well and the second major surface from about 150 nm to about 250 nm.

11. The pixelated LED of claim 7, wherein an angle between the substrate and a side of each electroluminescent element ranges from about 35 degrees to about 70 degrees.

12. The pixelated LED of claim 7, wherein each color converter comprises a potential well.

13. The pixelated LED of claim 12, wherein the potential well comprises a group II-VI or a group III-V semiconductor.

* * * * *

UNITED STATES PATENT AND TRADEMARK OFFICE
CERTIFICATE OF CORRECTION

PATENT NO.         : 9,196,653 B2                                     Page 1 of 1
APPLICATION NO.    : 13/384347
DATED              : November 24, 2015
INVENTOR(S)        : Catherine Leatherdale et al.

It is certified that error appears in the above-identified patent and that said Letters Patent is hereby corrected as shown below:

In the specification

Column 19
Line 34 (Approx.), Delete "ηforward" and insert -- ηforward, --, therefor.

Line 45, Delete "Crosstalk=ηside/(ηforward+ηside)" and insert
-- Crosstalk=ηside/(ηforward+ηside). --, therefor.

Column 20
Line 13, Delete "EPE=ηforward(η)×η0×η(J)." and insert -- EPE=ηforward(θ)×η0×η(J). --, therefor.

Line 38, Delete "0=55°" and insert -- θ=55° --, therefor.

Signed and Sealed this
Twenty-eighth Day of June, 2016

Michelle K. Lee
*Director of the United States Patent and Trademark Office*